US 6,704,093 B2

(12) United States Patent
Kurosawa

(10) Patent No.: US 6,704,093 B2
(45) Date of Patent: Mar. 9, 2004

(54) SCANNING EXPOSURE APPARATUS, SCANNING EXPOSURE METHOD, AND DEVICE MANUFACTURING METHOD

(75) Inventor: Hiroshi Kurosawa, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/077,860

(22) Filed: Feb. 20, 2002

(65) Prior Publication Data
US 2002/0145713 A1 Oct. 10, 2002

(30) Foreign Application Priority Data
Feb. 21, 2001 (JP) ....................... 2001-045651

(51) Int. Cl.⁷ .................... G03B 27/42; G03B 27/52
(52) U.S. Cl. .................................. 355/53; 355/55
(58) Field of Search .............................. 355/52–53, 55, 355/67–71, 77; 356/399–401; 250/548

(56) References Cited

U.S. PATENT DOCUMENTS

| 5,172,402 | A |   | 12/1992 | Mizusawa et al. | 378/34 |
| 5,243,377 | A | * | 9/1993  | Umatate et al.  | 355/53 |
| 5,377,251 | A |   | 12/1994 | Mizusawa et al. | 378/34 |
| 5,883,701 | A |   | 3/1999  | Hasegawa et al. | 355/53 |
| 5,898,477 | A |   | 4/1999  | Yoshimura et al.| 355/53 |
| 5,914,773 | A |   | 6/1999  | Kurosawa et al. | 355/53 |
| 6,049,372 | A | * | 4/2000  | Kato et al.     | 355/53 |
| 6,160,612 | A | * | 12/2000 | Itoh et al.     | 355/53 |
| 6,195,155 | B1| * | 2/2001  | Kawai           | 355/53 |
| 6,204,911 | B1|   | 3/2001  | Kurosawa et al. | 355/53 |
| 6,260,282 | B1| * | 7/2001  | Yuan et al.     | 33/1 M |
| 6,319,641 | B2| * | 11/2001 | Magome          | 430/22 |
| 6,501,533 | B1| * | 12/2002 | Murata          | 355/53 |
| 6,509,953 | B1| * | 1/2003  | Saiki et al.    | 355/53 |

FOREIGN PATENT DOCUMENTS

JP          2000-21716          1/2000

* cited by examiner

Primary Examiner—Henry Hung Nguyen
(74) Attorney, Agent, or Firm—Fitzpatrick, Cella, Harper & Scinto

(57) ABSTRACT

A scanning exposure apparatus transfers a pattern of a master to a substrate with slit-shaped exposure light while a master stage holding the master and a substrate stage holding the substrate are moved. The apparatus includes a measurement unit arranged to measure positional sync deviations between the master stage and the substrate stage with respect to each of a plurality of points in an exposure shot region on the substrate during scanning exposure of each of the plurality of points to the light, a first calculation unit arranged to calculate a standard deviation of the positional sync deviations measured by the measurement unit with respect to each of the plurality of points in the exposure shot region, and a second calculation unit arranged to calculate a variation of the standard deviations calculated by the first calculation unit with respect to the exposure shot region. In addition, a process unit is arranged to execute a process based on the vibration calculated by the second calculation unit.

20 Claims, 15 Drawing Sheets (RELATIONSHIP BETWEEN CONFIDENCE LIMIT VALUE AND DEGREE OF FREEDOM)

FIG. 13

| | |
|---|---|
| URL | http://www.maintain.co.jp/db/input.html |

TROUBLE DB INPUT WINDOW

OCCURRENCE DATE [ 2000/3/15 ] ~4040
TYPE OF APPARATUS [ ********** ] ~4010
OBJECT [ OPERATION ERROR (START-UP ERROR) ] ~4030
DEVICE S/N [ 465NS4580001 ] ~4020
DEGREE OF URGENCY [ D ] ~4050

SYMPTOM [ LED KEEPS FLICKERING AFTER POWER ON ] ~4060

REMEDY [ POWER ON AGAIN (PRESS RED BUTTON IN ACTIVATION) ] ~4070

PROGRESS [ INTERIM HAS BEEN DONE ] ~4080

(SEND) (RESET)

| 4100 | 4110 | 4120 |
|---|---|---|
| LINK TO RESULT LIST DATABASE | SOFTWARE LIBRARY | OPERATION GUIDE |

SCANNING EXPOSURE APPARATUS, SCANNING EXPOSURE METHOD, AND DEVICE MANUFACTURING METHOD

FIELD OF THE INVENTION

The present invention relates to a scanning exposure apparatus, scanning exposure method, and device manufacturing method.

BACKGROUND OF THE INVENTION

The influence of the positional shift between a reticle and a wafer during scanning exposure on a transfer image depends on the variation period of the relative shift amount. The average shift component between a reticle and a wafer while an exposure slit (slit-shaped exposure light) passes an arbitrary point on a wafer to be exposed is called a moving average (MA), which corresponds to the shift amount of a reticle image transfer position from a desired position. A component which vibrates while the exposure slit passes an arbitrary point on a wafer, i.e., a relatively short vibration period component is represented by the variance of the deviation or the moving standard deviation (MSD), which corresponds to the half-shade (blur) amount of a reticle pattern transfer image generated by a stage control error. Both the moving average and moving standard deviation are desirably small. It is important to provide these values as numerical evaluation measures.

Conventionally, the moving average or moving standard deviation within a shot is monitored and used as an index for analyzing a production lot error factor. More specifically, the worst value of the absolute moving average of each shot and the maximum value of the moving standard deviation of each shot are saved as logs of an exposure result. These values are compared with those of a shot determined as defective in the inspection step, and yield decrease factors can be tracked. The upper limit values of the moving average and moving standard deviation are set in advance. If the moving average and moving standard deviation exceed their upper limit values in scanning exposure, the exposure apparatus is stopped and overhauled before another defective lot is generated.

FIG. 3 is a graph showing the simulation results of the relationship between the moving standard deviation (MSD) and the CD (Critical Dimension) value during scanning exposure. The difference from the CD value at a position MSD=0 is a decrease in line width depending on MSD. For a large MSD, the half-shade amount becomes large, and the transfer line width becomes small.

Variations in the line width of a reticle pattern transfer image on a wafer serve as an important factor representing the performance of an integrated circuit. Variations in line width correspond to variations in moving standard deviation (MSD). As a prior art, MSD and MA values are sequentially calculated. However, an apparatus or method for evaluating MSD variations and utilizing the evaluation result has not been proposed yet.

SUMMARY OF THE INVENTION

The present invention has been made in consideration of the above situation, and has as its object to provide an apparatus and method for evaluating, e.g., variations in moving standard deviation and utilizing the evaluation result.

The first aspect of the present invention relates to a scanning exposure apparatus for transferring a pattern of a master onto a substrate with slit-shaped exposure light while a master stage holding the master and a substrate stage holding the substrate are moved at a predetermined speed ratio. The scanning exposure apparatus comprises a measurement unit arranged to measure a sync deviation between the master stage and the substrate stage, an arithmetic unit arranged to calculate variations in a plurality of moving standard deviations corresponding to a plurality of points on the substrate on the basis of a plurality of sync deviations measured by the measurement unit, and a control unit arranged to control an exposure job on the basis of an arithmetic result by the arithmetic unit.

According to a preferred aspect of the present invention, the control unit preferably has a determination unit arranged to determine whether the variations in the plurality of moving standard deviations calculated by the arithmetic unit satisfy a predetermined criterion, and preferably controls the exposure job on the basis of a determination result by the determination unit.

According to another preferred aspect of the present invention, the arithmetic unit preferably calculates, as the variations in the plurality of moving standard deviations, maximum and minimum values serving as predetermined confidence limit values in a $\chi^2$ distribution. The control unit preferably has a determination unit arranged to determine whether the maximum and minimum values satisfy corresponding predetermined criteria, and preferably controls the exposure job on the basis of a determination result by the determination unit. Alternatively, the control unit preferably has a determination unit arranged to determine whether a difference between the maximum and minimum values satisfies a predetermined criterion, and preferably controls the exposure job on the basis of a determination result by the determination unit. The control unit preferably has a determination unit arranged to determine whether a mean value between the maximum and minimum values satisfies a predetermined criterion, and preferably controls the exposure job on the basis of a determination result by the determination unit. Alternatively, the control unit preferably has a determination unit arranged to determine whether a difference between the maximum and minimum values and a mean value between the maximum and minimum values satisfy corresponding predetermined criteria, and preferably controls the exposure job on the basis of a determination result by the determination unit.

According to still another preferred aspect of the present invention, the arithmetic unit preferably calculates, as the variations in the plurality of moving standard deviations, at least one of a contrast value and contrast variations of an image transferred onto the substrate.

According to still another preferred aspect of the present invention, the control unit preferably controls a subsequent exposure job so as to adjust the variations in the plurality of moving standard deviations calculated by the arithmetic unit to satisfy a predetermined criterion.

According to still another preferred aspect of the present invention, the control unit preferably controls a subsequent exposure job on the basis of variations in a plurality of moving standard deviations obtained in the past so as to adjust the variations in the plurality of moving standard deviations to satisfy the predetermined criterion in the subsequent exposure job. The control unit preferably has an adjustment unit arranged to adjust a settling time between start of constant-speed traveling and start of exposure after the master stage and the substrate stage are accelerated, and preferably controls a subsequent exposure job so as to adjust, by adjusting the settling time, the variations in the plurality of moving standard deviations to satisfy the predetermined criterion in the subsequent exposure job. Alternatively, the control unit preferably has an adjustment unit arranged to adjust moving speeds of the master stage and the substrate stage, and preferably controls a subsequent exposure job so as to adjust, by adjusting the moving speeds, the variations in the plurality of moving standard deviations to satisfy the predetermined criterion in the subsequent exposure job. Alternatively, the control unit preferably has an adjustment unit arranged to adjust an exposure order of a plurality of shots of the substrate, and preferably controls a subsequent exposure job so as to adjust, by adjusting the exposure order, the variations in the plurality of moving standard deviations to satisfy the predetermined criterion in the subsequent exposure job. Alternatively, the control unit preferably has an application unit arranged to apply a vibration to at least one of the master stage and the substrate stage, and an adjustment unit arranged to adjust an amplitude of the vibration, and preferably controls a subsequent exposure job so as to adjust, by adjusting the amplitude of the vibration, the variations in the plurality of moving standard deviations to satisfy the predetermined criterion in the subsequent exposure job.

According to still another preferred aspect of the present invention, the arithmetic unit preferably calculates variations in a plurality of moving standard deviations for a plurality of shots on the substrate.

According to still another preferred aspect of the present invention, the control unit preferably has an output unit arranged to output a predetermined message on the basis of the arithmetic result by the arithmetic unit.

According to still another preferred aspect of the present invention, the control unit preferably has a recording unit arranged to record the arithmetic result by the arithmetic unit and/or a control log based on the arithmetic result.

According to still another preferred aspect of the present invention, the control unit preferably has a transfer unit arranged to transfer the arithmetic result by the arithmetic unit and/or a control log based on the arithmetic result to an external device.

According to still another preferred aspect of the present invention, the control unit preferably has a unit arranged to stop the exposure job on the basis of the arithmetic result by the arithmetic unit.

According to still another preferred aspect of the present invention, the control unit preferably has a defective shot count determination unit arranged to determine whether the number of shots determined to be defective on the basis of the arithmetic result by the arithmetic unit exceeds a predetermined count, and preferably controls the exposure job on the basis of a determination result by the defective shot count determination unit.

The second aspect of the present invention relates to a scanning exposure method of transferring a pattern of a master onto a substrate with slit-shaped exposure light while a master stage holding the master and a substrate stage holding the substrate are moved at a predetermined speed ratio. The scanning exposure method comprises the measurement step of measuring a sync deviation between the master stage and the substrate stage, the arithmetic step of calculating variations in a plurality of moving standard deviations corresponding to a plurality of points on the substrate on the basis of a plurality of sync deviations measured in the measurement step, and the control step of controlling an exposure job on the basis of an arithmetic result calculated in the arithmetic step.

The third aspect of the present invention relates to a device manufacturing method comprising the steps of installing a plurality of semiconductor manufacturing apparatuses including the above-described scanning exposure apparatus in a factory, and manufacturing a semiconductor device by using the plurality of semiconductor manufacturing apparatuses. According to still another preferred aspect of the present invention, the manufacturing method preferably further comprises the steps of connecting the plurality of semiconductor manufacturing apparatuses to a local area network, connecting the local area network to an external network outside the factory, acquiring information about the scanning exposure apparatus from a database on the external network by using the local area network and the external network, and controlling the scanning exposure apparatus on the basis of the acquired information.

The fourth aspect of the present invention relates to a semiconductor manufacturing factory comprising a plurality of semiconductor manufacturing apparatuses including the above-described scanning exposure apparatus, a local area network for connecting the plurality of semiconductor manufacturing apparatuses, and a gateway for connecting the local area network to an external network outside the semiconductor manufacturing factory.

The fifth aspect of the present invention relates to a maintenance method for a scanning exposure apparatus, comprising the steps of preparing a database for accumulating information about maintenance of the scanning exposure apparatus on an external network outside a factory where the above-described scanning exposure apparatus is installed, connecting the scanning exposure apparatus to a local area network in the factory, and maintaining the scanning exposure apparatus on the basis of information accumulated in the database by using the external network and the local area network.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 2 is a block diagram showing the arrangement of a controller for controlling a wafer stage 16 and reticle stage 5 of the scanning exposure apparatus shown in FIG. 1, and the flow of numerical information concerning measurement results, arithmetic results, and the like;

FIG. 13 is a view showing a user interface on the display;

DETAILED DESCRIPTION OF THE PREFERRED EMBODIMENTS

According to a preferred embodiment of the present invention, a plurality of sync error data between a reticle stage (master stage) and a wafer stage (substrate stage) during exposure of one shot undergo arithmetic processing to obtain the variation amount of the moving standard deviation (MSD) during exposure that corresponds to the line width variation amount generated by the stage. Whether the variation amount of the moving standard deviation (MSD) falls within a predetermined level is monitored. If the variation amount of the moving standard deviation (MSD) exceeds the level, exposure operation stops to prevent in advance the line width from greatly varying above a prescribed amount. According to the preferred embodiment of the present invention, shots greatly varying in moving standard deviation (MSD) are observed on a plurality of wafers. As for a shot at a position where the moving standard deviation (MSD) greatly varies, line width variations are unified by, e.g., decreasing the scanning speed, prolonging the settling time (or equivalent traveling distance) before shift to scanning exposure, or adding intentional vibrations.

The preferred embodiment of the present invention will be described in more detail below with reference to the accompanying drawings.

Figure 1:
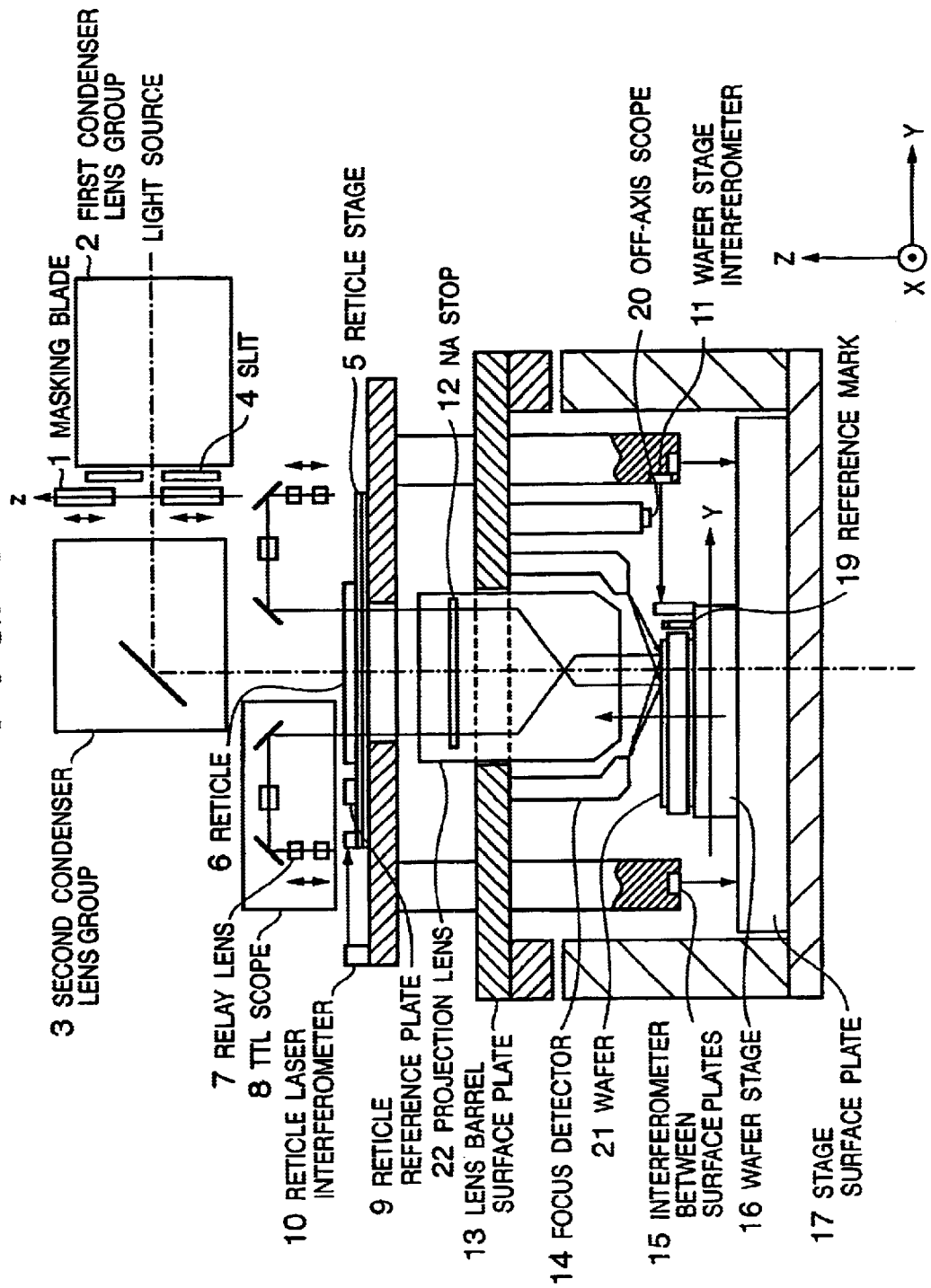
FIG. 1 is a view showing the schematic arrangement of a scanning exposure apparatus according to a preferred embodiment of the present invention.

FIG. 1 is a view showing the schematic arrangement of a scanning exposure apparatus according to the preferred embodiment of the present invention. An exposure beam output from a light source such as an excimer laser reaches a slit 4 via a first condenser lens group 2. The slit 4 narrows the exposure beam into a slit-shaped beam having a width of about 7 mm along the Z-axis, and adjusts the illuminance integrated along the Z-axis so as to be uniform within a predetermined range along the X-axis. A masking blade 1 moves following the end of the pattern drawing field angle of a reticle (master) 6 when a reticle stage (master stage) 5 and wafer stage (substrate stage) 16 are scanned for exposure. The masking blade 1 prevents an exposure beam from striking the light-transmitting portion of the reticle 6 and being projected on a wafer (substrate) 21 while the reticle stage 5 is decelerated after the end of pattern transfer of the reticle 6. The exposure beam having passed through the masking blade 1 illuminates the reticle 6 on the reticle stage 5 via a second condenser lens group 3. The exposure beam having passed through the pattern of the reticle 6 reaches the wafer 21 as an exposure slit (slit-shaped exposure beam) via a projection lens 22, and forms the imaging plane of the reticle pattern near the surface of the wafer 21. The projection lens 22 incorporates an NA stop 12, which allows changing the illumination mode in exposure.

One-dimensionally movable TTL scopes 8 measure the X-, Y-, and Z-axis positions of an alignment mark on the reticle 6 and those of an alignment mark formed on a reference mark 19 on the wafer 21 or wafer stage 16 by using the absolute position reference of the TTL scope as a reference. A relay lens 7 is used to adjust the focus of the TTL scope 8. By referring to the position of the relay lens 7 when the alignment mark is in best focus, the focus (position along the Z-axis) of an object to be detected can be measured. In FIG. 1, two TTL scopes 8 are arranged in the Y direction for illustrative convenience. In practice, still another TTL scope is arranged in the X direction. This arrangement enables measuring tilts in the $\omega x$ and $\omega y$ directions between the reticle alignment mark and the reference mark 19 on the wafer 21 or wafer stage 16. The TTL scope 8 shown in FIG. 1 can be driven toward the center of the field angle (Y-axis direction).

The reticle stage 5 is controlled in the X, Y, and $\theta$ directions using three reticle laser interferometers 10. FIG. 1 shows only one reticle laser interferometer 10. In practice, however, two reticle laser interferometers 10 and one reticle laser interferometer 10 are respectively arranged along the Y- and X-axes. The reticle stage 5 is movable in the X, Y, and $\theta$ directions along a guide disposed on a lens barrel surface plate 13. As for the Y-axis, the reticle stage 5 can move over a long stroke in order to execute scanning exposure while moving in synchronism with the wafer stage 16. As for the X- and $\theta$-axes, the reticle stage 5 can move only within a small range because it is sufficient to eliminate an error generated when the reticle stage 5 chucks the reticle 6. The exposure apparatus has a structure which escapes a reaction force generated by driving the reticle stage 5 to a reaction force absorption device (not shown) rigidly connected to a base plate 18. The lens barrel surface plate 13 does not shake in reaction to driving. The reticle stage 5 supports a reticle reference plate 9, and a mark observable with the TTL scope 8 is drawn on the plate.

A focus detector 14 measures the Z, $\omega x$, and $\omega y$ positions of the wafer 21 or reference mark 19 on the wafer stage 16 at high speed regardless of the presence/absence of the mark without the mediacy of the projection lens 22. The focus detector 14 is used for focus measurement in exposure while the reticle stage 5 and wafer stage 16 are synchronously scanned. To guarantee the long-term stability of the measurement precision, the focus detector 14 performs self calibration by comparing the result of measuring the reference mark 19 on the wafer stage 16 by the TTL scope 8 with the result of measuring the reference mark 19 by the focus detector 14.

An off-axis scope 20 has a single-lens focus measurement function and an X/Y-direction alignment error measurement function. To align a wafer in a general mass production job, the off-axis scope 20 performs global tilt measurement and global alignment measurement. The global tilt correction amount and global alignment correction amount are simultaneously used when the wafer stage 16 is so stepped as to position the wafer exposure area below the projection lens 22.

The lens barrel surface plate 13 serves as a base for attaching the precision measurement device of the exposure apparatus. The lens barrel surface plate 13 is positioned while slightly floating above the base plate 18 directly set on the floor. Since the above-described focus detector 14 and TTL scope 8 are attached to the lens barrel surface plate 13, the measurement values of these measurement devices eventually represent the relative distance from the lens barrel surface plate. An interferometer 15 between surface plates measures the relative positional relationship between the lens barrel surface plate 13 and a stage surface plate 17. In this embodiment, the sum of a measurement result by the interferometer 15 and a measurement result by a triaxial Z sensor (not shown) mounted on the wafer stage 16 is so controlled as to coincide with a target value designated by a host sequence. Accordingly, the wafer 21 on the wafer stage 16 is so maintained as to coincide with a target value in the focus direction designated from the host sequence to the lens barrel surface plate 13. Similar to the interferometers for the reticle stage 5, three wafer stage interferometers 11 are arranged and used to control the wafer stage 16 in the X, Y, and θ directions.

The stage surface plate 17 is positioned while slightly floating from the base plate 18, similar to the lens barrel surface plate 13. The stage surface plate 17 has a function of removing vibrations transmitted from the floor to the wafer stage 16 via the base plate 18, and a function of absorbing a reaction force upon driving the wafer stage 16 and escaping the reaction force to the base plate 18. The wafer stage 16 is mounted on the stage surface plate 17 while slightly floating from it.

Figure 2:
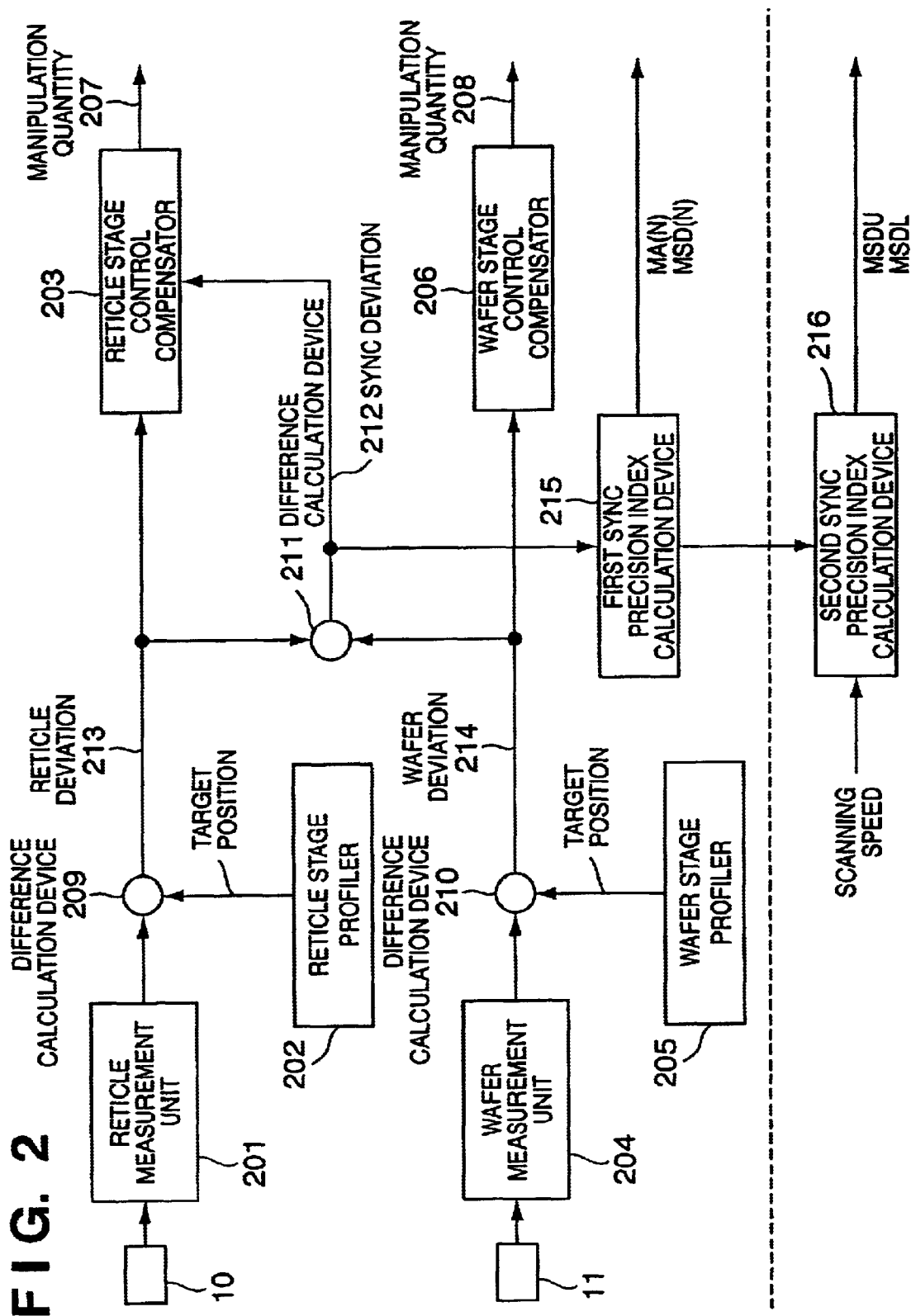
Figure 3:
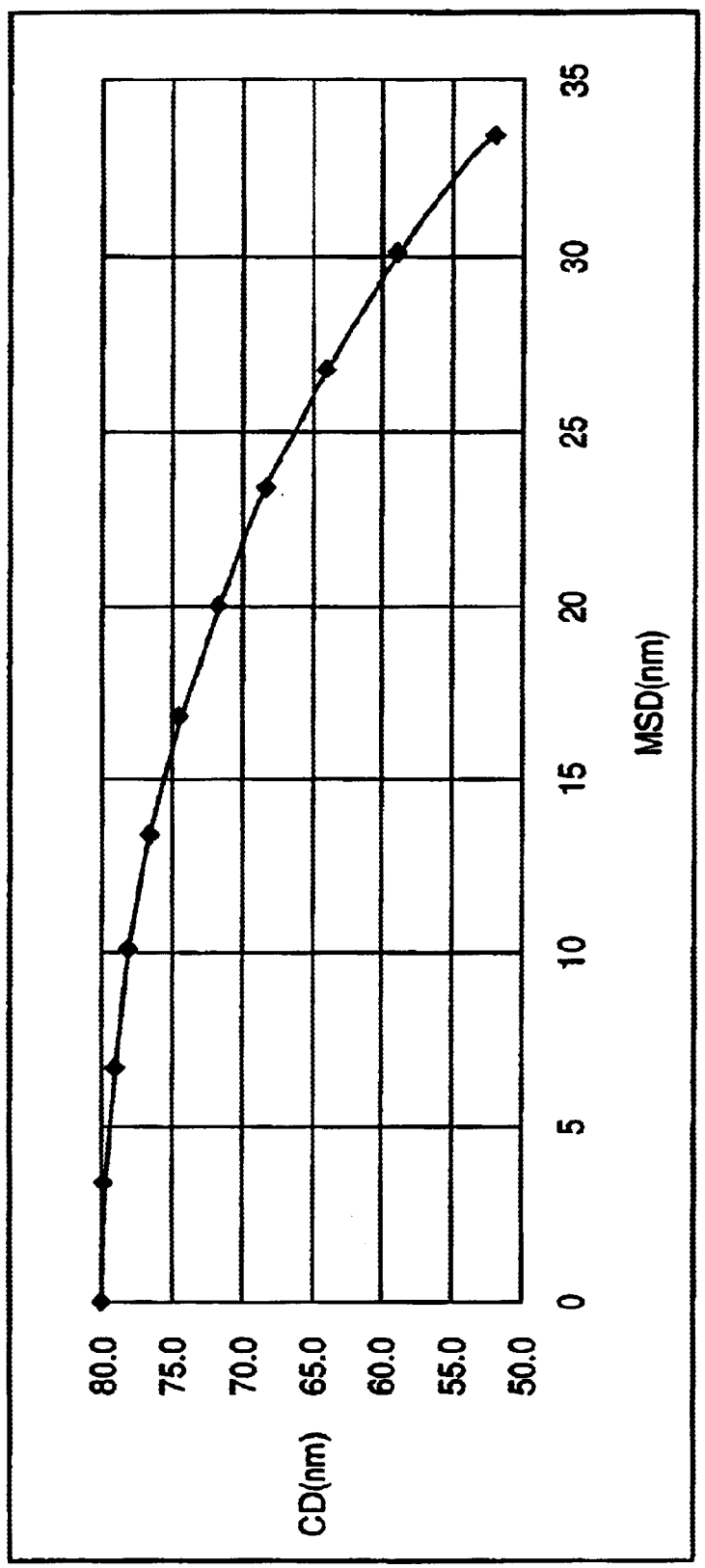
FIG. 3 is a graph showing the simulation results of the relationship between the moving standard deviation (MSD) and the CD (Critical Dimension) value during scanning exposure.

FIG. 2 is a block diagram showing the arrangement of a controller for controlling the wafer stage 16 and reticle stage 5 of the scanning exposure apparatus shown in FIG. 1, and the flow of numerical information concerning measurement results, arithmetic results, and the like. Arithmetic processing shown in FIG. 2 is repetitively executed every cycle of the reference clock (servo clock) of a control system (not shown) for the exposure apparatus. This mechanism can be implemented by, e.g., assembling these processes into a handler routine activated by a timer interrupt.

The coordinates of the reticle stage 5 are measured along the X-, Y-, and θ-axes by the reticle laser interferometer 10. A measurement signal as a measurement result is counted as an integrated position signal by a reticle measurement unit 201. A reticle stage profiler 202 generates at a predetermined servo clock interval a target position used to scan and drive the reticle stage 5. The difference between the target position and an output as a current position from the reticle measurement unit 201 is calculated by a difference calculation device 209, and output as a reticle deviation 213 representing the shift between the position of the reticle stage 5 and its target position. The reticle deviation 213 is servo-calculated by a reticle stage control compensator 203 into a manipulation quantity 207 to be provided to the driving unit (not shown) of the reticle stage 5.

The coordinates of the wafer stage 16 are measured along the X-, Y-, θ-, ωx-, and ωy-axes by the laser interferometer. A measurement signal as a measurement result is counted as an integrated position signal by a wafer measurement unit 204. A wafer stage profiler 205 generates at a predetermined servo clock interval a target position used to scan and drive the wafer stage 16. The speed ratio of driving target values in the scanning direction that are generated by the reticle stage profiler 202 and wafer stage profiler 205 in synchronously scanning the reticle stage 5 and wafer stage 16 coincides with the projection ratio of the projection lens 22.

The difference between the target position generated by the wafer stage profiler 205 and an output as a current position from the wafer measurement unit 204 is calculated by a difference calculation device 210, and output as a wafer deviation 214 representing the shift between the wafer stage 16 and its target position.

The difference between the reticle deviation 213 and the wafer deviation 214 is calculated by a difference calculation device 211, and output as a sync deviation 212 between the reticle stage 5 and the wafer stage 16. The wafer deviation 214 is servo-calculated by a wafer stage control compensator 206 into a manipulation quantity 208 for the driving unit (not shown) of the wafer stage 16. The sync deviation 212 corresponds to a shift amount from a desired position when a reticle image is projected on a wafer. To minimize the sync deviation, the reticle stage control compensator 203 corrects and drives the reticle stage 5 which is lower in mass than the wafer stage 16. The sync deviation 212 can be detected every cycle of the servo clock. The sync deviation 212 during scanning exposure sequentially undergoes averaging processing or variation amount mean-square processing within a slit width, thereby calculating the moving average (MA) and moving standard deviation (MSD). The moving average (MA) and moving standard deviation (MSD) at an arbitrary slit position during exposure are calculated by a first sync precision index calculation device 215 for the number (N) of servo clocks during exposure in accordance with equations (to be described later). The sync deviations or standard deviations of (N) points at one or a plurality of shots on a wafer during the exposure period are transferred to a second sync precision index calculation device 216 after the end of exposure processing for the shots. The second sync precision index calculation device 216 calculates variations in moving standard deviation (MSD), and outputs an upper limit (MSDU) and lower limit (MSDL) as confidence limit values determined for, e.g., a likelihood of 99.7% corresponding to 3σ.

The sync precision during scanning exposure is generally represented by the moving average (MA) as the mean value of the sync deviation while an exposure slit passes a given point on a wafer, and the standard deviation (MSD) of the sync deviation while the exposure slit passes the point. The MA and MSD values can be detected every cycle of the servo clock during exposure. A plurality of measurement results can be obtained by scanning and exposing one shot. The measurement results of about 140 samples are obtained when a shot is scanned at a field angle of 26×33 mm, a servo clock of 4 [kHz], and 210 [mm/sec]. The results of performing processing such as maximum/minimum value detection or averaging on these numerical values are conventionally used as an apparatus performance evaluation measure. In a conventional evaluation method which takes over a stepper evaluation method, the apparatus performance is evaluated by the sum (m+3σ) of the standard deviation (3σ) of the sync deviation and the worst value (m) of the moving average (MA) within a shot. This conventional evaluation method is an index which guarantees the alignment precision in the worst case, but is not sufficient as an index representing the apparatus performance. For example, for a large moving average (MA), the deviation is hardly distributed around −(m+3σ) because the deviation distribution is around MA. From this, the apparatus performance is regarded to be excessively low. As for a scanner, there is an evaluation method using the maximum MA/MSD value as a standard value. However, this evaluation method may generate an abnormal value due to local contamination of a sample wafer or variations in thickness at the wafer end face. This relatively scarce phenomenon inhibits determining a standard value.

The sync error distribution during scanning exposure is experimentally observed to take a distribution shape very similar to a normal distribution. The moving standard deviation (MSD) calculated on the assumption that the sync error distribution is a normal distribution represents the width of a half-shade region formed by the stage during exposure, and serves as a measure representing a decrease in line width. MSD decreases if the settling time is short until shift to scanning exposure after the end of accelerating the stage. The settling time is influenced by an immediately preceding stage driving profile shape. In other words, the MSD value may vary if the shot layout or exposure order is changed. During scanning exposure, a wafer surface is tracked in the focus and tilt ($\omega x$ and $\omega y$) directions. This generates a disturbance, decreasing the sync precision. That is, the surface state of the wafer or wafer chuck decreases or varies MSD.

MSD variations correspond to variations in exposure line width caused by stage control. Variations in exposure line width are an important factor which determines the performance of a manufactured semiconductor element and the yield. Such variations must be suppressed, and a method of expressing the variations by a numerical index is required. Hence, MSD variations is an important evaluation measure which should be pursued as an absolute precision index in the scanning exposure apparatus. To obtain this measure, a method of numerically representing "the mean value and variations of moving standard deviations (MSD) within a shot" is necessary. This representation method is a more appropriate evaluation index for representing the basic performance of the apparatus concerning the moving standard deviation.

The intra-slit moving average (MA) and intra-slit moving standard deviation (MSD) are calculated by the following equation at the sample rate of the servo clock of the control system. The MA and MSD values obtained by exposure of one shot depend on the scanning speed. When a shot 33 [mm] in the Y direction is exposed at a scanning speed of 210 [mm/sec], about 760 pairs of data are obtained. The moving average (MA) is an index representing the shift amount of the transfer position of a reticle image during exposure using an exposure slit. Since each stage receives integral control, the mean of moving averages (MA) at a plurality of points within a time corresponding to about one shot is almost 0. The moving standard deviation (MSD) is an index representing the half-shade amount (blur) of a reticle transfer image generated by the stage. This index, which is a root-mean-square value, always takes a positive value.

$$MA(Y) = \frac{1}{N} \sum_{k=1}^{N} \varepsilon(Y - D/2 + kVT) \quad (1)$$

$$MSD(Y) = \sqrt{\frac{1}{N} \sum_{k=1}^{N} \{\varepsilon(Y - D/2 + kVT) - MA(Y)\}^2} \quad (2)$$

where $\varepsilon(y)$: deviation at a scanning position y $(=Y-D/2+kVT)$

MA(Y): average moving value at a scanning position Y
Y: scanning position
D: slit width (generally about 7.5 [mm])
V: scanning speed
T: sample clock rate (in this case, 250 [$\mu$sec/sample])
N=int(D/VT): the number of sample clocks within a slit To calculate the target "mean value and variations of moving standard deviations within a shot", the distribution shape of samples for the moving standard deviation MSD (Y) must be attained. Variations in moving standard deviation MSD(Y) mean the distribution of "the root-mean-square values of N sync errors ($\varepsilon(Y-D/2+kVT)-MA(Y))$". This distribution exhibits a specific distribution profile other than a normal distribution. Thus, variations in moving standard deviation within a shot cannot be obtained from $3\sigma$ prepared by calculating the standard deviation of the moving standard deviations (MSD) of samples. The upper and lower confidence limit values for 99.7% corresponding to $3\sigma$ that have conventionally been used must be newly estimated.

It is known that, when a plurality of samples are extracted from a set of samples which exhibit a normal distribution, the probability density distribution of the sum of the squares of the samples is one called the $\chi^2$ distribution. The distribution of the moving standard deviation MSD(Y) is conformed to the $\chi^2$ distribution profile, which enables estimating the variation width of the moving standard deviation MSD(Y).

The distribution of the moving standard deviation MSD (Y) cannot strictly conform to the $\chi^2$ distribution. However, the distribution of the moving standard deviation MSD(Y) can be examined as the $\chi^2$ distribution on the basis of two assumptions: (1) MA(Y)=0; the moving average value used to calculate the moving standard deviation is always 0, and (2) $\varepsilon(y)$ is not a set of successive sample points within an exposure slit, but is extracted at random from arbitrary points within the exposure shot ($==\varepsilon_k$).

Under either assumption, variations in moving standard deviation MSD(Y) are safely estimated large. These assumptions simplify the moving standard deviation MSD (Y) from a function of Y into $$MSD = \sqrt{\sum_{k=1}^{N} \left(\frac{\varepsilon_k^2}{N}\right)} \quad (3)$$

On the assumption that the sync error probability distribution on each stage is a normal distribution, a relation:

$$P(\varepsilon_k)=N(\mu_0, \sigma_0^2) \quad (4)$$

is established.

If a random variable z is defined as given by equation (5), a probability density distribution $P_N(z)$ complies with the $\chi^2$ distribution. Since $\mu_0$ is the mean of deviations within a shot, the deviation of a low-frequency component is almost 0 in normal exposure and is regarded as 0.

$$z = \sum_{k=1}^{N} \left(\frac{\varepsilon_k - \mu_0}{\sigma_0}\right)^2 \cong \frac{1}{\sigma_0^2} \sum_{k=1}^{N} \varepsilon_k^2 \quad (5)$$

The sum of the squares of N samples belonging to a normal distribution N(0, 1) complies with the $\chi^2$ distribution, and the profile is given by equation (6). The mean value of the $\chi^2$ distribution is N (degree of freedom), and the peak of the distribution is closer to N for larger N.

$$P_N(z) = \frac{z^{N/2-1}}{2^{N/2}\Gamma(N/2)} e^{-z/2} \quad (6)$$

The profile shape of $P_N(z)$ changes depending on the degree N of freedom. N corresponds to the number of deviation samples while an exposure slit passes one point on a wafer. If the scanning speed changes, the number of deviation samples also changes. The $P_N(z)$ shape also changes depending on the scanning speed. When the degree of freedom is 240 or more, the profile cannot be obtained due to an overflow in a long floating-point number representation ($10^{-308}$ to $10^{308}$). Hence, the profile is obtained using a recurrence formula when the degree of freedom is relatively large. The gamma function has the property of equation (7), so that equation (6) is changed into a recurrence formula:

$$\Gamma(\lambda+1)=\lambda\Gamma(\lambda) \qquad (7)$$

$$P_{N+2}(z) = \frac{(z/2)^{N/2+1}e^{-z/2}}{z\Gamma(N/2+1)} = \frac{z}{N}P_N(z) \qquad (8)$$

By calculating $P_{239}(z)$ and $P_{240}(z)$ in advance from equation (8), profiles for larger degrees of freedom can be obtained stepwise. That is, when N is an odd number, $P_N(z)$ can be sequentially calculated from $P_{239}(z)$; when N is an even number, $P_N(z)$ can be sequentially calculated from $P_{240}(z)$. To obtain from the $P_N(z)$ shape the upper and lower limits of a region where 99.7% samples corresponding to a rate of 3σ are distributed as for z in the $\chi^2$ distribution, definite integrals in equations (9) and (10) are actually conducted to search for a value from which integral starts.

Figure 4:
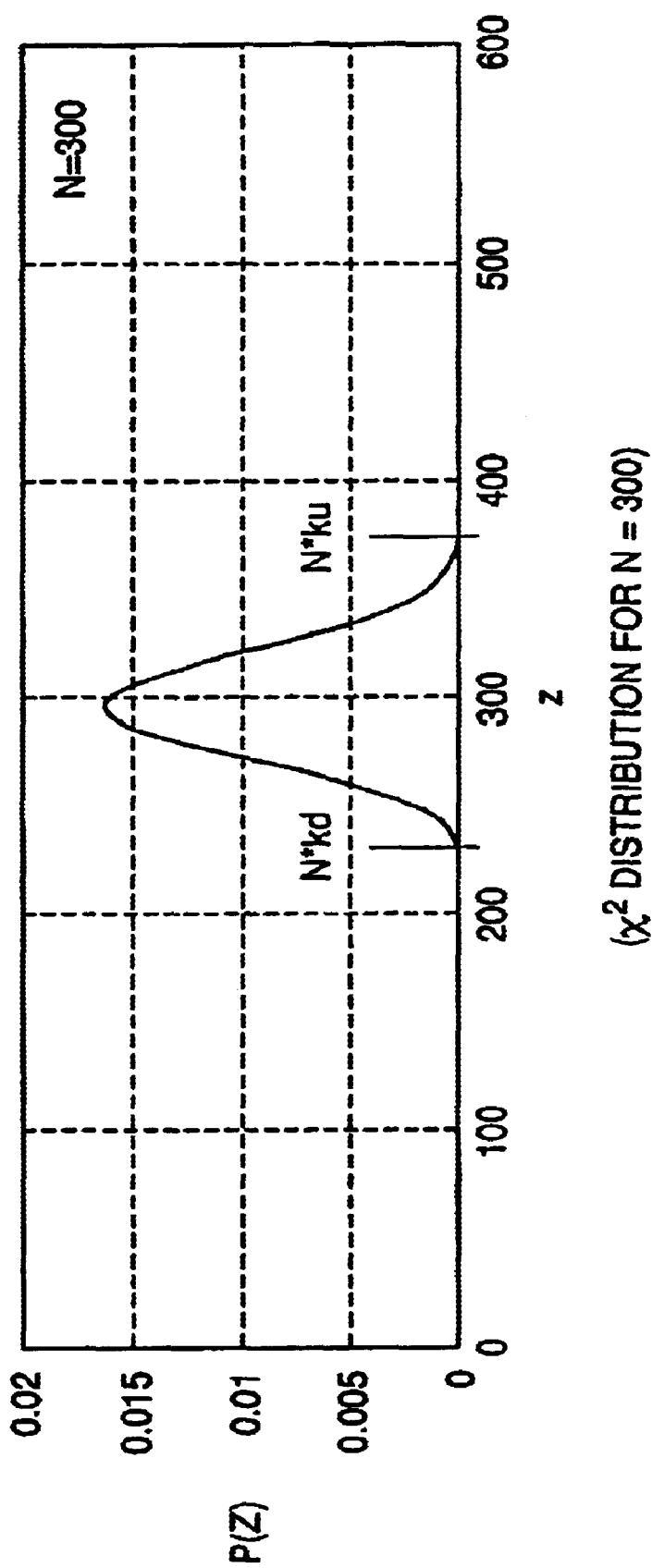
FIG. 4 is a graph showing the $\chi^2$ distribution when the degree (N) of freedom is 300.

The $\chi^2$ distribution (N=300) has a shape as shown in FIG. 4. Letting (MSDU=) $N*k_u$ be the upper confidence limit set by a likelihood of 99.73%, and (MSDL=) $N*k_d$ be the lower confidence limit, the sum of an integral value from the upper limit ($N*k_u$) to the infinite and an integral value from 0 to the lower limit ($N*k_d$) should be 0.27%. Although the probability density distribution is not strictly symmetric, equal probabilities are assigned above the upper limit and below the lower limit.

Considering these conditions, equations (9) and (10) must be satisfied:

$$\int_0^{Nk_d} P_N(z)dz = 0.00135 \qquad (9)$$

$$\int_{Nk_u}^{\infty} P_N(z)dz = 0.00135 \qquad (10)$$

Figure 5:
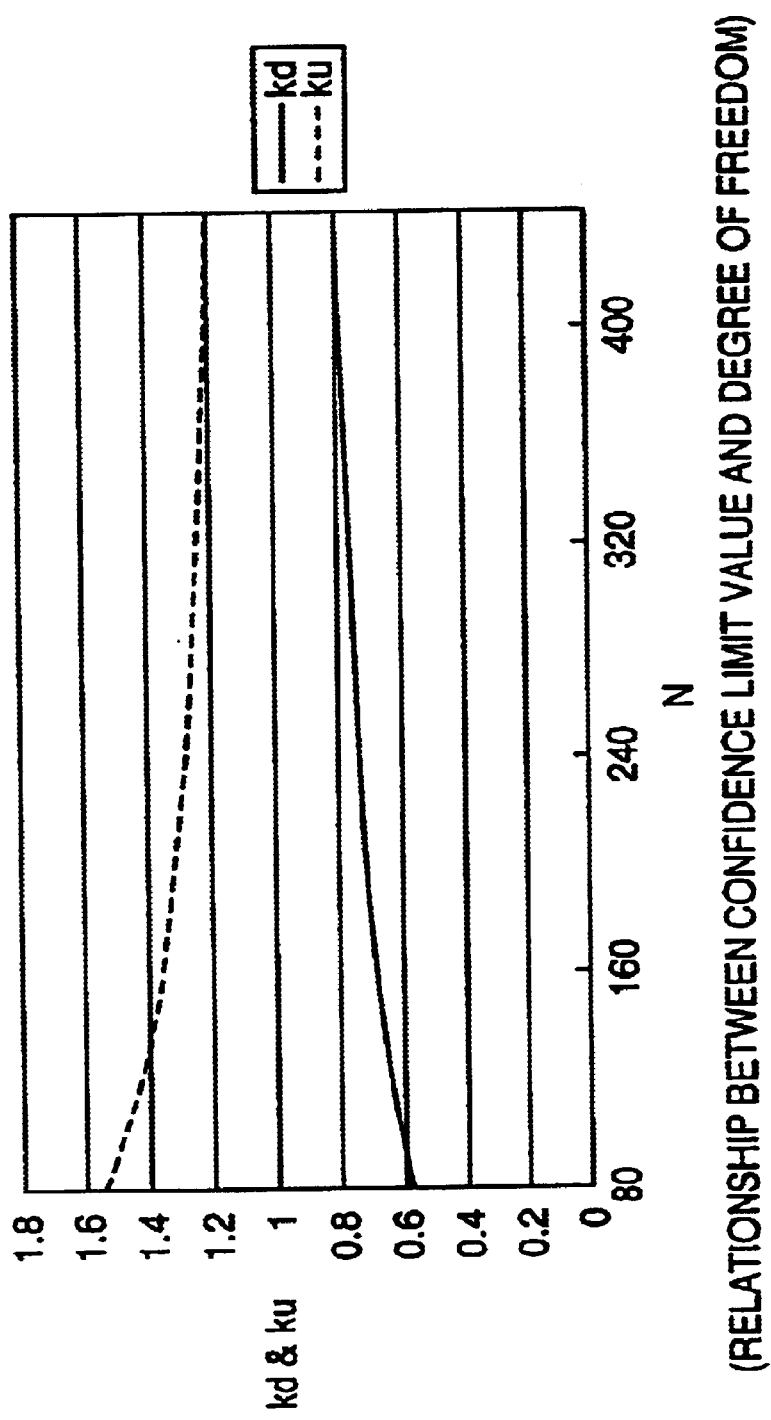
FIG. 5 is a graph showing the confidence limit value and the degree (N) of freedom.

FIG. 5 is a graph of $k_u$ and $k_d$ which satisfy the definite integrals and are obtained for various degrees of freedom while the degree N of freedom is used as a variable. As the degree of freedom becomes larger, the distribution range of the sum of squares becomes narrower. If the servo clock rate is high with the same standard deviation within a shot, $k_u$ and $k_d$ are estimated smaller because of a large N.

On the other hand, the moving standard deviation (MSD) to be obtained and the z value have the following relationship:

$$MSD^2 = \frac{1}{N}\sum_{k=1}^{N}(\varepsilon_k^2) = \frac{\sigma_0^2}{N}z \qquad (11)$$

$$MSD = \sigma_0\sqrt{\frac{z}{N}} \qquad (12)$$

Figure 6:
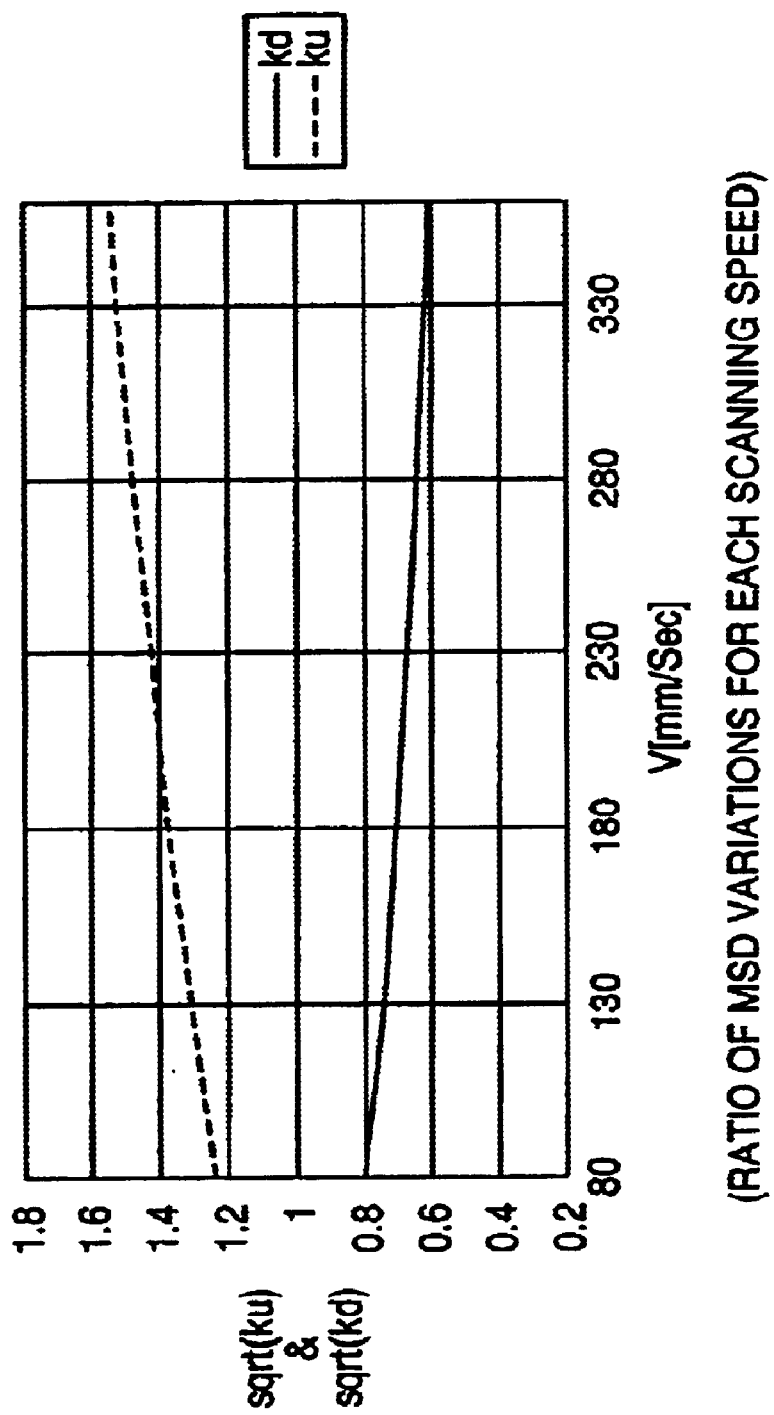
FIG. 6 is a graph showing the ratio of MSD variations for each scanning speed.

From equation (10), z is rewritten into $k_u$ and $k_d$ to obtain the upper and lower confidence limit values of MSD from the standard deviation of the sync deviation $\varepsilon_k$ in the entire shot. FIG. 6 is a graph plotting from this relationship the ratio of variations in moving standard deviation (MSD) for each scanning speed.

From the graph shape of FIG. 6, MSD greatly varies if the scanning speed is high with the same MSD value (in this case, the number of samples within a slit is small), and less varies if the scanning speed is low. The relationship of FIG. 6 is for stage position deviation samples normalized into N(0,1), and can be arbitrarily used by holding the relationship between the scanning speed V and values $Fk_u(V)=sqrt(k_u(V))$ and $Fk_d(V)=sqrt(k_d(V))$ as a table calculated in advance. In other words, the upper limit (maximum value) and lower limit (minimum value) of the distribution of the moving standard deviation (MSD) within a shot can be easily obtained by reading $k_u$ and $k_d$ values from FIG. 6 as far as the number of samples of servo clocks within an exposure slit and the standard deviation values of sync deviations sampled at a plurality of points within the shot are prepared as inputs. For example, when the standard deviation of the sync deviation within the entire shot is 20 [nm] upon scanning exposure at a scanning speed of 300 [mm/sec], N=100, and 99.7% samples are distributed between (MSDL=) sqrt($k_d$)*20=15.82 [nm] and (MSDU=) sqrt($k_u$) *20=24.32 [nm] as the moving standard deviation (MSD).

Calculation of the upper and lower limits of the distribution of the moving standard deviation (MSD) on the basis of the $Fk_u(V)$ and $Fk_d(V)$ values and the standard deviations of sync deviations sampled at a plurality of points within the entire shot is executed for each shot, a plurality of shots, or in accordance with an event within one wafer. This calculation is performed by the second sync precision index calculation device 216 shown in FIG. 2. The second sync precision index calculation device 216 holds a function shown in FIG. 6. The first sync precision index calculation device 215 performs calculation for each servo clock, as described above.

Figure 7:
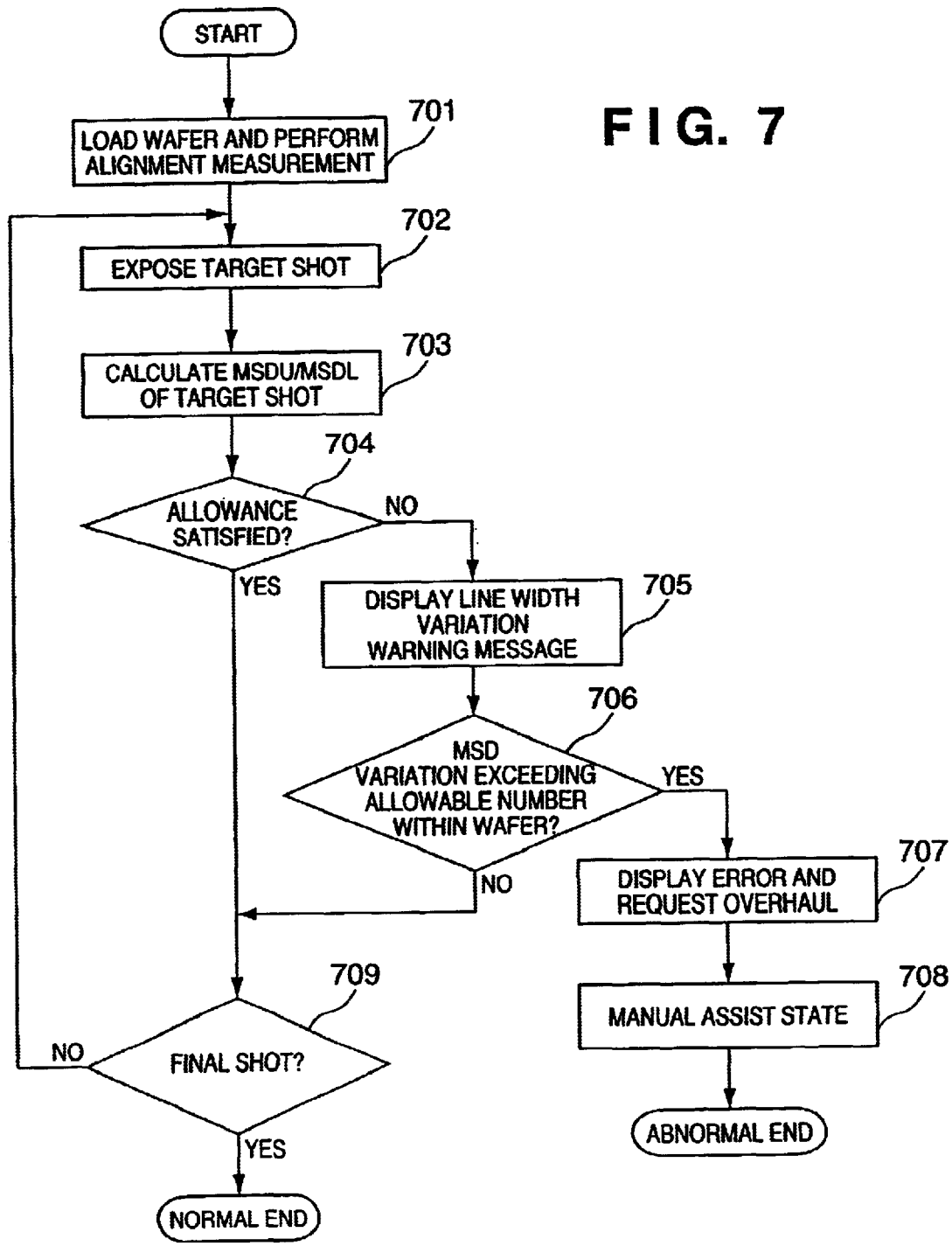
FIG. 7 is a flow chart showing an example of an exposure sequence concerning processing of one wafer in the scanning exposure apparatus shown in FIG. 1 according to the preferred embodiment of the present invention.

FIG. 7 shows an example of an exposure sequence concerning processing of one wafer in the scanning exposure apparatus shown in FIG. 1 according to the preferred embodiment of the present invention. After an exposure job starts, a wafer is loaded onto the wafer stage 16, and the alignment measurement step is executed in step S701. In step S702, one target shot is exposed while the stage feed position is corrected by an alignment correction amount corresponding to the alignment measurement result in accordance with an order designated in the exposure job. At this time, the wafer stage 16 and reticle stage 5 are controlled by the devices 201 to 206 and 209 to 211 of the controller shown in FIG. 2. At the same time, the first sync precision index calculation device 215 calculates the moving average (MA) and moving standard deviation (MSD) for a plurality of points within the shot at the sample rate of the servo clock. The sync deviations or standard deviations of the points within the shot during the exposure period are transferred to the second sync precision index calculation device 216 after the end of exposure processing of the shot.

In step S703, the second sync precision index calculation device 216 calculates the standard deviations of the sync deviations of the points within the shot during the exposure period. Further, the second sync precision index calculation device 216 calculates the upper limit value (MSDU) and lower limit value (MSDL) of the moving standard deviation (MSD) as variations in moving standard deviation (MSD) at this shot on the basis of the calculation results or the standard deviations transferred from the first sync precision index calculation device 215. In this step, the worst value or mean value of the moving standard deviation (MSD) may also be calculated. To analyze the yield of the semiconductor production process, the calculated values are preferably transferred as online data to a host computer (not shown) or saved in a log file.

In step S704, whether MSDU and MSDL calculated by the second sync precision index calculation device 216 satisfy preset criteria (allowances) is checked. If "YES" in step S704, the flow shifts to step S709; if "NO", to step S705. The criteria (allowances) may be, e.g., 1) the lower and upper limit values of the moving standard deviation, or 2) at least one of a design contrast value ((MSDU+MSDL)/2) and the allowance (MSDU−MSDL) of line width variations (i.e., contrast variations). In this case, the contrast value and/or contrast variations are calculated based on MSDU and MSDL calculated by the second sync precision index calculation device 216, and compared with a contrast value and/or contrast variations serving as criteria. This method has the advantage of easy intuitive understanding.

In step S709, whether all the shots have been exposed is checked. If an unexposed shot exists ("NO" in step S709), the flow returns to step S702; if "YES", a series of processes end.

If MSDU and MSDL are determined in step S704 not to satisfy the preset criteria (allowances) (i.e., an error is determined to have occurred), a warning message that line width variations do not satisfy a predetermined criterion is displayed on a man-machine interface (not shown) in step S705. At this time, the exposure job may stop to wait for manual operation. However, variations in moving standard deviation (MSD) may not satisfy the criterion (allowance) owing to a process or environmental factor such as the influence of external vibrations or contamination of a wafer surface. To separate these factors from an apparatus factor, generation of an error is preferably determined by checking whether errors have occurred a plurality of number of times. In this embodiment, whether the generation number of errors falls within an allowable number is determined in step S706. If "YES" in step S706, the flow advances to step S709 to continue the exposure job. If "NO" in step S706, a message requesting an overhaul is displayed on the man-machine interface (not shown) in step S707, and the flow shifts to a manual assist state in step S708.

Factors which degrade the sync precision (evaluated by, e.g., MSD variations) are as follows:

(Factor 1) Shortage of Settling Time before Exposure

In accelerating the wafer stage 16 at rest for scanning exposure, the wafer stage 16 receives a large external force by acceleration. If the exposure apparatus shifts to exposure operation a proper settling time after the wafer stage 16 has been accelerated and is driven at a predetermined speed, the moving standard deviation (MSD) at the start of scanning exposure degrades.

(Factor 2) Variations in Settling Time by Shot Layout

The magnitude of an external force applied to the wafer stage 16 before scanning exposure changes depending on a position from which the wafer stage 16 is moved stepwise in order to expose a shot at a given position before shift to scanning exposure of the shot. The settling time also changes depending on the magnitude of the external force. Hence, variations in moving standard deviation (MSD) change depending on the shot position or layout. This phenomenon is prominent particularly when the wafer stage 16 is moved stepwise in a direction other than the scanning direction.

(Factor 3) Influence of Tilt Tracking Control on Sync Precision in X/Y Direction During Scanning If a tilt component is controlled during scanning, an amount corresponding to the product of the rotation amount and the distance from the center of rotation of the tilt axis to the wafer surface acts as a disturbance in the X and Y directions. This disturbance cannot be completely eliminated if the control rigidity of the X-Y stage (not shown) of the wafer stage 16 cannot be sufficiently ensured.

(Factor 4) External Vibrations

Of vibrations from the floor, components which cannot be absorbed by the stage surface plate 17 are added as a factor which degrades the sync precision in the X and Y directions.

(Factor 5) Adjustment Error of Control Parameter and Contact between Movable Component and Precision Measurement Component The sync precision degrades when, e.g., improper installation of the exposure apparatus shifts the targets of notch filters set on the control compensators 206 and 203 of the wafer stage 16 and reticle stage 5 for performing feedback which avoids a resonance point determined by the mechanical rigidity of a component that constitutes the exposure apparatus main body or stage. The sync precision may also degrade upon generating a mounting trouble such as contact between the measurement head of the projection lens 22 and a cable.

Figure 10:
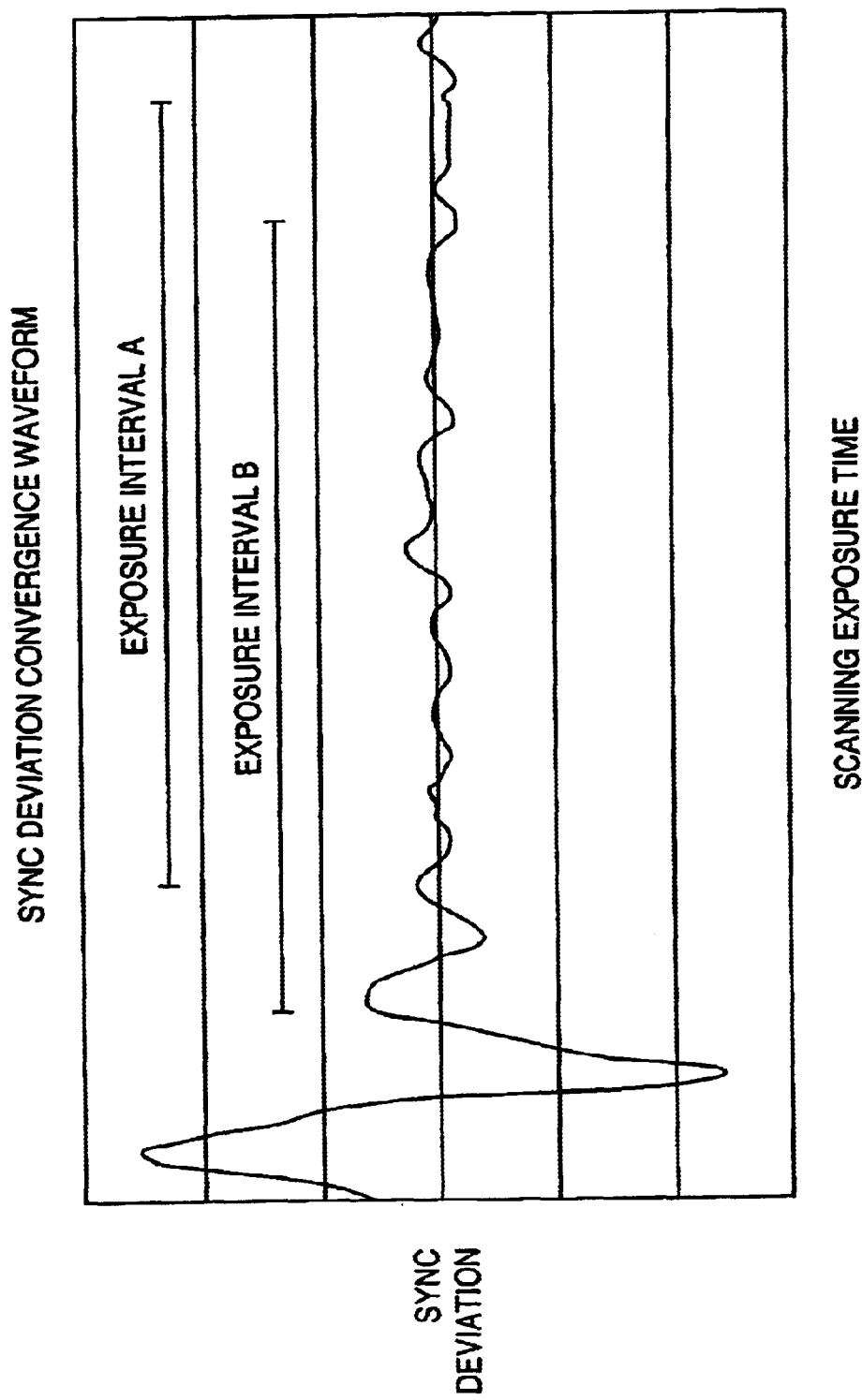
FIG. 10 is a graph for explaining the relationship between the sync deviation convergence waveform and the exposure interval on the wafer stage and reticle stage.

Of these factors, (factor 1) and (factor 2) can be solved by prolonging the settling time (or equivalent traveling time) before the start of scanning exposure for a defective shot. FIG. 10 shows the relationship between the sync deviation convergence waveform and the exposure interval on the wafer stage 16 and reticle stage 5 in order to explain the effect of prolonging the settling time. In an exposure interval B, the slit moving standard deviation greatly varies at the start of exposure of a shot because scanning exposure starts before the sync deviation does not satisfactorily converge. The difference (MSDU−MSDL) of the slit moving standard deviation value becomes large between the exposure start position and a subsequent position, greatly varying the contrast within the shot. To the contrary, in an exposure interval A having a longer settling time than that of the exposure interval B, exposure starts after the sync deviation sufficiently converges. Thus, the (MSDU−MSDL) value (i.e., line width variations) within the shot becomes small.

(Factor 2) can be reduced by changing the exposure order or scanning direction of scanning exposure shots. By determining an exposure order so as to expose adjacent shots as sequentially as possible, application of a large acceleration speed by long-stroke driving can be suppressed to increase the sync precision.

As for (factor 3), vibrations which tilt the wafer stage 16 in the tilt direction are reduced by decreasing the scanning speed. The X-Y stage can satisfactorily suppress a disturbance generated by the tilt.

If (factor 4) occurs only intermittently, shots which do not satisfy the criterion and a wafer which includes many defective shots should be sent to rework processing.

As for (factor 5), the operation of the exposure apparatus should be stopped to overhaul the exposure apparatus.

As for the method of changing the exposure order or direction, a general layout is almost the optimal one, and there is little room for improving the exposure order. The method of prolonging the settling time (or equivalent traveling distance) or decreasing the scanning speed is a means for reliably increasing the sync precision. In either case, the productivity (throughput) of the exposure apparatus per unit time decreases. These methods should be applied at minimum. When the moving standard deviation MSD greatly varies at shots at the same position within the same lot, it is desirable for subsequent wafers to prolong the settling time (or equivalent traveling distance) in exposing a shot at this position or to decrease the scanning speed. As another method, when an error is determined in step S706 in exposure of one wafer within the same lot, the settling time (or equivalent traveling distance) is prolonged or the scanning speed is decreased in subsequent processing (for the remaining shots of the current wafer or other wafers).

Figure 8:
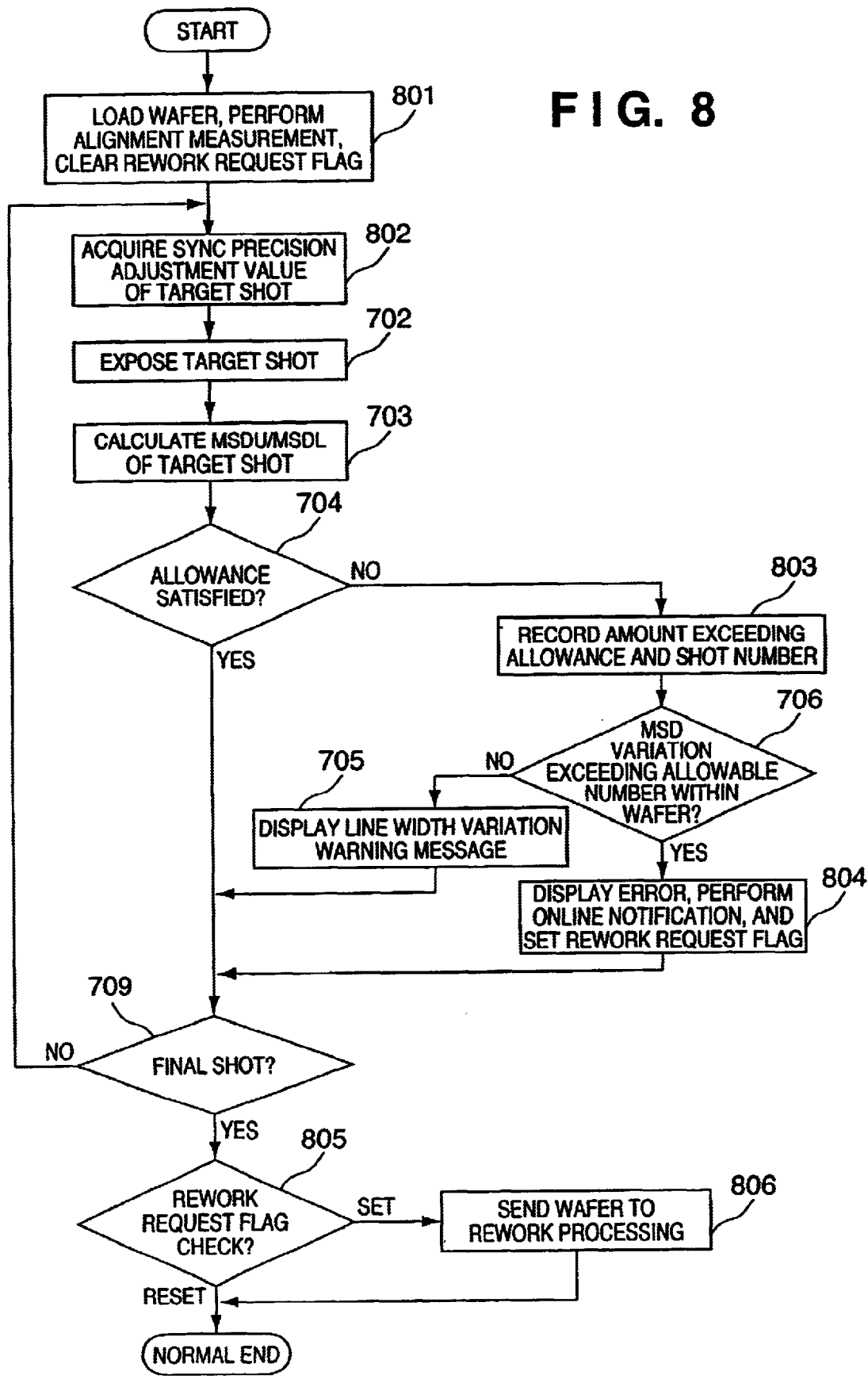
FIG. 8 is a flow chart showing another example of the exposure sequence concerning processing of one wafer in the scanning exposure apparatus shown in FIG. 1 according to the preferred embodiment of the present invention.

FIG. 8 shows another example of the exposure sequence concerning processing of one wafer in the scanning exposure apparatus shown in FIG. 1 according to the preferred embodiment of the present invention. This example adopts an automatic processing function in addition to the exposure sequence shown in FIG. 7. The same reference numerals as in the exposure sequence shown in FIG. 7 denote the same parts, and a description thereof will be omitted.

In step S801, a wafer is loaded, and alignment measurement is done. Then, a rework request flag for a target wafer is cleared. In step S802, a sync precision adjustment value determined based on the maximum value MSDU and minimum value MSDL of the slit moving standard deviation for a shot corresponding to the target exposure shot of a target exposure wafer out of the shots of a previously exposed wafer within the same lot is acquired. The sync precision adjustment value is an exposure condition parameter for performing scanning exposure such that MSDU and MSDL meet their criteria (allowances). An example of this parameter is one for adjusting the settling time (or equivalent traveling distance) or the scanning speed, which has been described as a measure against (factor 1) to (factor 3). Prolonging the settling time (or equivalent traveling distance) or decreasing the scanning speed can decrease the difference between MSDU and MSDL to increase the sync precision, but increases the wafer processing time. This adjustment value may be a parameter representing the amplitude of vibrations applied when vibrations are intentionally applied during scanning projection exposure to generate a predetermined sync deviation, as disclosed in Japanese Patent Laid-Open No. 2000-21716. This amplitude adjustment method can control the slit moving standard deviation at an arbitrary position on a wafer without decreasing the throughput.

As for a shot which does not satisfy the criterion (allowance) in step S704, a deviation (amount exceeding allowance) from the criterion and the shot number are stored in a memory in step S803. Deviations from the criterion and shot numbers are stored in the memory for a plurality of wafers throughout exposure processing of wafers. An error (criterion is not satisfied) which repetitively occurs at shots at the same position is specified based on the deviations and shot numbers stored in the memory, and a sync precision adjustment value for decreasing the difference between MSDU and MSDL at a shot at this position can be determined.

Instead of actually exposing a wafer, dummy exposure may be performed without emitting any light from an exposure light source before a plurality of wafers are actually exposed, thereby obtaining a sync precision adjustment value. This adjustment value may be used as a sync precision adjustment value for each shot in actual exposure.

If the generation number of errors is determined in step S706 to exceed the allowable count, an error message indicative of this is displayed in step S804, and an online host machine (not shown) is notified of this. At this time, the rework request flag is set.

After the final shot is exposed ("YES" in step S709), the state of the rework request flag is confirmed in step S805. If the rework request flag is set, the current wafer is sent to rework processing in step S806, and the processing ends.

Figure 9:
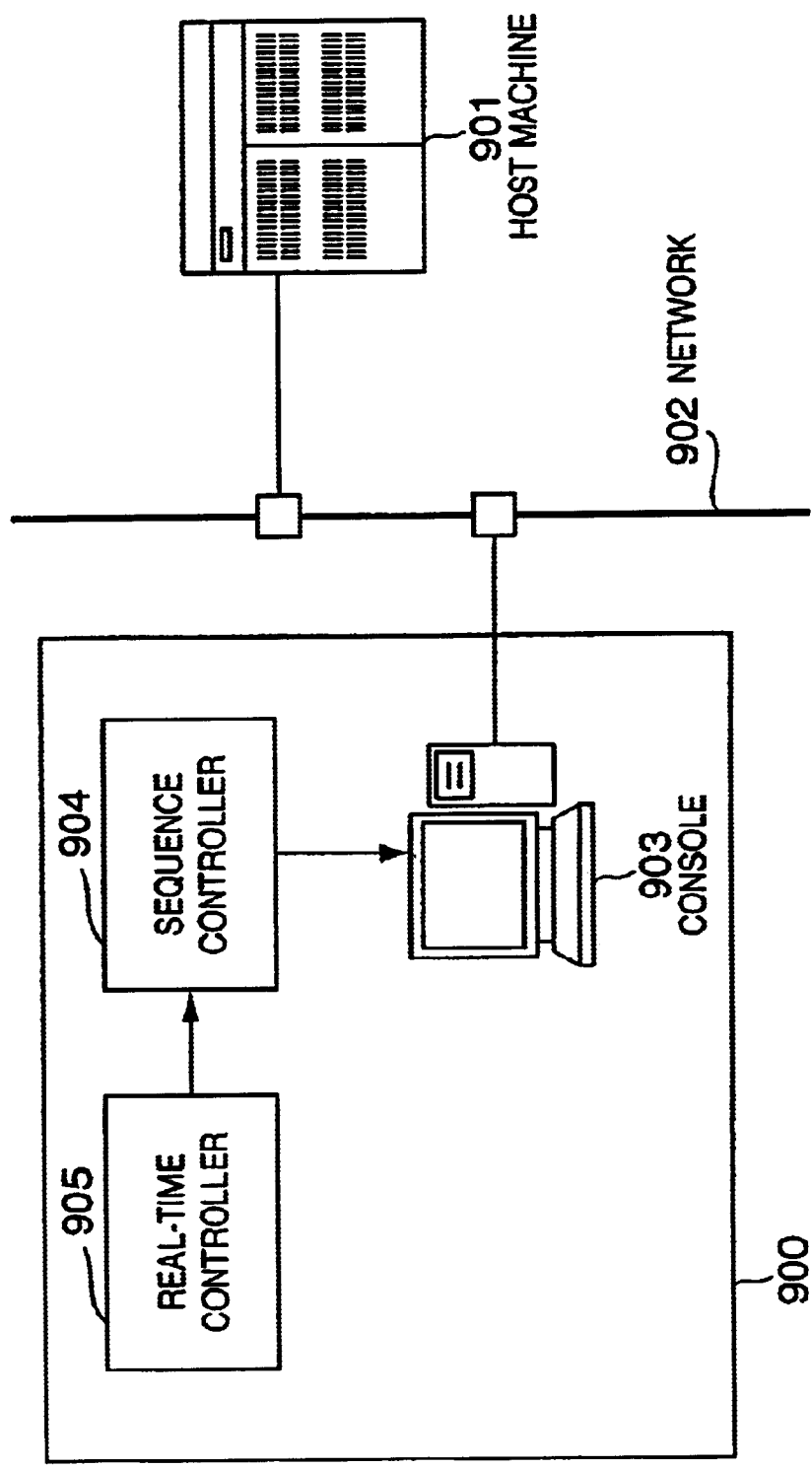
FIG. 9 is a block diagram showing a control system for various manufacturing apparatuses including the scanning exposure apparatus shown in FIG. 1 according to the preferred embodiment of the present invention.

FIG. 9 is a block diagram showing a control system for various manufacturing apparatuses including the scanning exposure apparatus shown in FIG. 1 according to the preferred embodiment of the present invention. A host machine 901 controls various exposure apparatuses (including a scanning exposure apparatus 900 shown in FIG. 1), a CD apparatus, and the like. The host machine 901 is connected via a network 902 to a console 903 incorporated in the scanning exposure apparatus 900. The console 903 includes the man-machine interface of the scanning exposure apparatus 900. The console 903 calculates a line width variation value on the basis of the display of an error or warning described with reference to FIGS. 7 and 8, or MSDU and MSDL values obtained for each shot, and displays and logs (stores in a memory) the calculated value. The console 903 transfers to the host machine 901 processing results such as information about the sync precision of a processed wafer and the generation log of the error or warning. A sequence controller 904 executes control shown in the flow charts of FIGS. 7 and 8. A real-time controller 905 is a processor for performing servo-control and real-time correction of the wafer stage 16 and reticle stage 5. For example, the arrangement above the dotted line in FIG. 2 is assembled into the real-time controller 905, whereas the arrangement below the dotted line is assembled into the sequence controller 904.

According to the preferred embodiment of the present invention, variations in line width within a shot caused by the stage in the scanning exposure apparatus are represented by numerical indices (MSDU and MSDL), and monitored to minimize generation of a defective lot owing to abnormal variations in line width. The indices (MSDU and MSDL) for variations in line width are effective to analyze a defective factor in order to increase the yield in the semiconductor manufacturing process.

If the sync precision is abnormal (e.g., MSDU and MSDL deviate from their criteria), the scanning speed is decreased or the settling time (or equivalent traveling distance) is prolonged to avoid an error, or vibrations are intentionally added to keep the slit moving standard deviation constant. As a result, variations in the line width of a semiconductor element caused by the apparatus can be suppressed to a desired value or less.

A production system for a semiconductor device (semiconductor chip such as an IC or LSI, liquid crystal panel, CCD, thin-film magnetic head, micromachine, or the like) using the above-described scanning exposure apparatus will be exemplified. A trouble remedy or periodic maintenance of a manufacturing apparatus installed in a semiconductor manufacturing factory, or maintenance service such as software distribution is performed by using a computer network outside the manufacturing factory.

Figure 11:
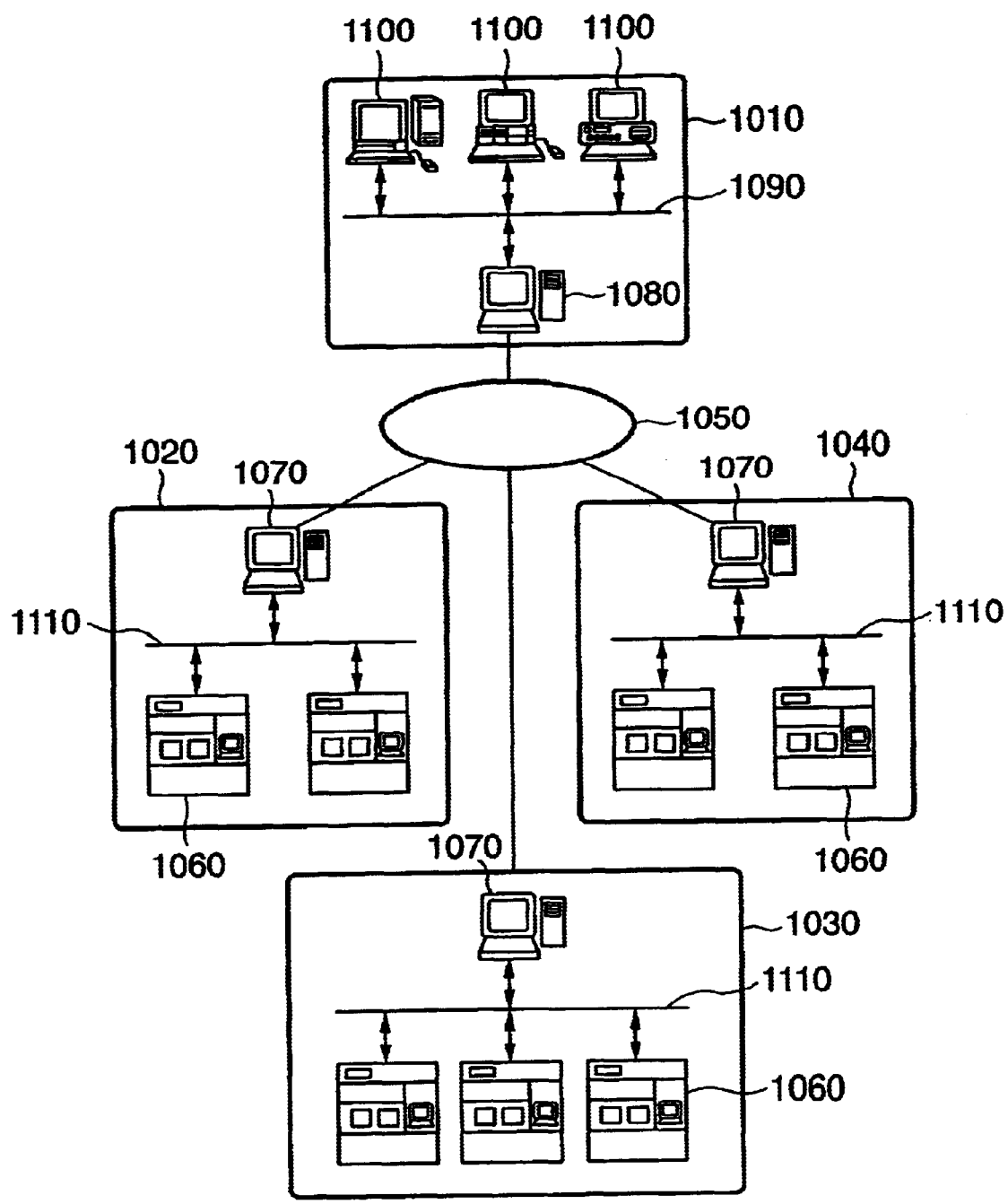
FIG. 11 is a view showing the concept of a semiconductor device production system when viewed from a given angle.

FIG. 11 shows the overall system cut out at a given angle. In FIG. 11, reference numeral 1010 denotes a business office of a vendor (apparatus supply manufacturer) which provides a semiconductor device manufacturing apparatus. Examples of the manufacturing apparatus are semiconductor manufacturing apparatuses for various processes used in a semiconductor manufacturing factory, such as pre-process apparatuses (lithography apparatus such as an exposure apparatus (including the scanning exposure apparatus in FIG. 1), resist processing apparatus, and etching apparatus, annealing apparatus, film formation apparatus, planarization apparatus, and the like) and post-process apparatuses (assembly apparatus, inspection apparatus, and the like). The business office 1010 comprises a host management system 1080 for providing a maintenance database for the manufacturing apparatus, a plurality of operation terminal computers 1100, and a LAN (Local Area Network) 1090 which connects the host management system 1080 and computers 1100 to build an intranet. The host management system 1080 has a gateway for connecting the LAN 1090 to Internet 1050 as an external network of the business office, and a security function for limiting external accesses.

Reference numerals 1020 to 1040 denote manufacturing factories of the semiconductor manufacturer as users of manufacturing apparatuses. The manufacturing factories 1020 to 1040 may belong to different manufacturers or the same manufacturer (pre-process factory, post-process factory, and the like). Each of the factories 1020 to 1040 is equipped with a plurality of manufacturing apparatuses 1060, a LAN (Local Area Network) 1110 which connects these apparatuses 1060 to construct an intranet, and a host management system 1070 serving as a monitoring apparatus for monitoring the operation status of each manufacturing apparatus 1060. The host management system 1070 in each of the factories 1020 to 1040 has a gateway for connecting the LAN 1110 in the factory to the Internet 1050 as an external network of the factory. Each factory can access the host management system 1080 of the vendor 1010 from the LAN 1110 via the Internet 1050. Typically, the security function of the host management system 1080 authorizes access of only a limited user to the host management system 1080.

In this system, the factory notifies the vendor via the Internet 1050 of status information (e.g., the symptom of a manufacturing apparatus in trouble) representing the operation status of each manufacturing apparatus 1060. The vendor transmits, to the factory, response information (e.g., information designating a remedy against the trouble, or remedy software or data) corresponding to the notification, or maintenance information such as the latest software or help information. Data communication between the factories 1020 to 1040 and the vendor 1010 and data communication via the LAN 1110 in each factory typically adopt a communication protocol (TCP/IP) generally used in the Internet. Instead of using the Internet as an external network of the factory, a dedicated network (e.g., ISDN) having high security which inhibits access of a third party can be adopted. Also the user may construct a database in addition to the one provided by the vendor and set the database on an external network, and the host management system may authorize access to the database from a plurality of user factories.

Figure 12:
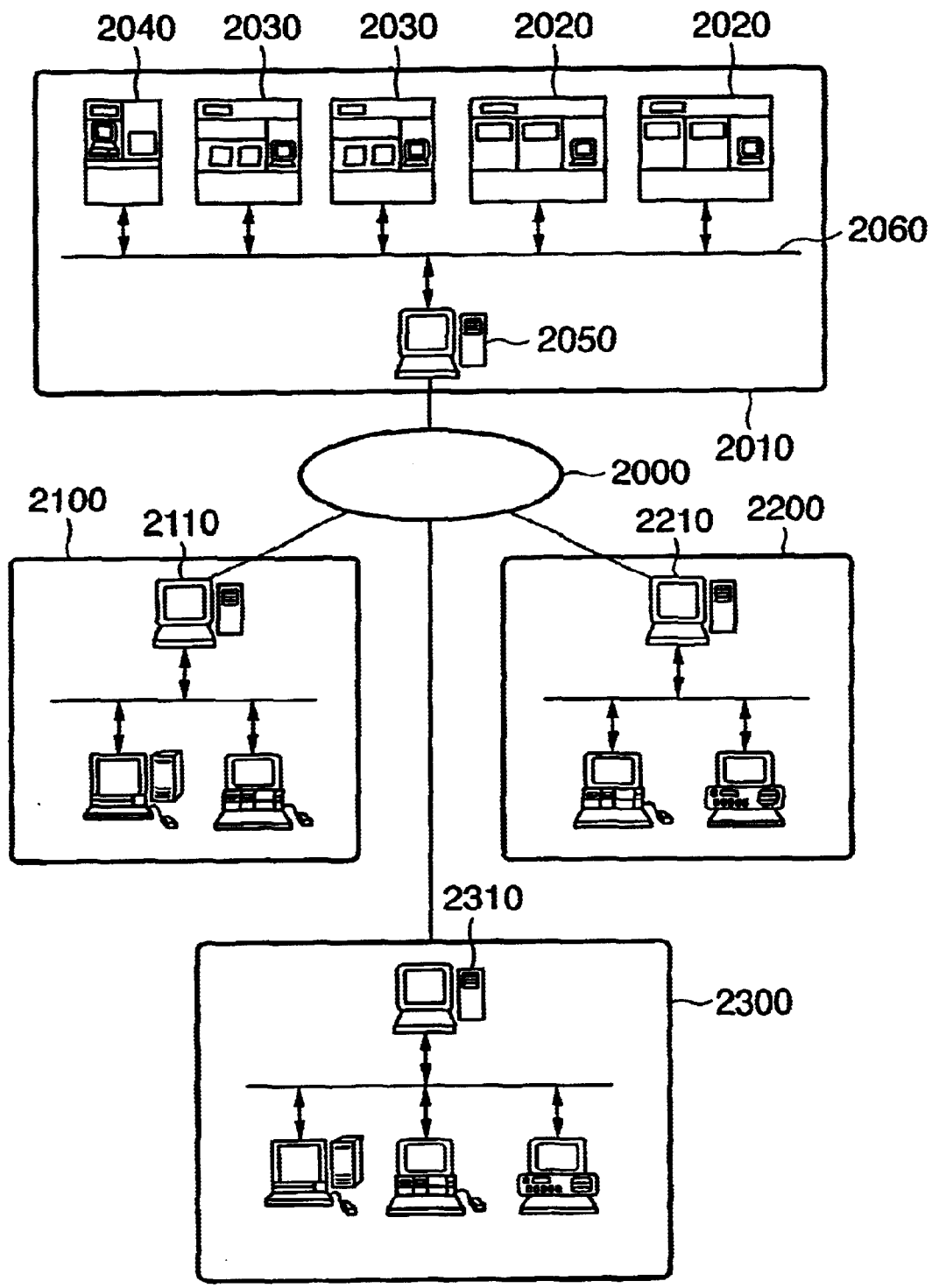
FIG. 12 is a view showing the concept of the semiconductor device production system when viewed from another angle.

FIG. 12 is a view showing the concept of the overall system of this embodiment that is cut out at a different angle from FIG. 11. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 12, a factory having manufacturing apparatuses of a plurality of vendors and the management systems of the vendors for these manufacturing apparatuses are connected via the external network of the factory, and maintenance information of each manufacturing apparatus is communicated. In FIG. 12, reference numeral 2010 denotes a manufacturing factory of a manufacturing apparatus user (semiconductor device manufacturer) where manufacturing apparatuses for various processes, e.g., an exposure apparatus 2020, resist processing apparatus 2030, and film formation apparatus 2040 are installed in the manufacturing line of the factory. FIG. 12 shows only one manufacturing factory 2010, but a plurality of factories are networked in practice. The respective apparatuses in the factory are connected to a LAN 2060 to build an intranet, and a host management system 2050 manages the operation of the manufacturing line. The business offices of vendors (apparatus supply manufacturers) such as an exposure apparatus manufacturer 2100, resist processing apparatus manufacturer 2200, and film formation apparatus manufacturer 2300 comprise host management systems 2110, 2210, and 2310 for executing remote maintenance for the supplied apparatuses. Each host management system has a maintenance database and a gateway for an external network, as described above. The host management system 2050 for managing the apparatuses in the manufacturing factory of the user, and the management systems 2110, 2210, and 2310 of the vendors for the respective apparatuses are connected via the Internet or dedicated network serving as an external network 2000. If a trouble occurs in any one of a series of manufacturing apparatuses along the manufacturing line in this system, the operation of the manufacturing line stops. This trouble can be quickly solved by remote maintenance from the vendor of the apparatus in trouble via the Internet 2000. This can minimize the stop of the manufacturing line.

Each manufacturing apparatus in the semiconductor manufacturing factory comprises a display, a network interface, and a computer for executing network access software and apparatus operating software which are stored in a storage device. The storage device is a built-in memory, hard disk, or network file server. The network access software includes a dedicated or general-purpose web browser, and provides a user interface having a window as shown in FIG. 13 on the display. While referring to this window, the operator who manages manufacturing apparatuses in each factory inputs, in input items on the windows, pieces of information such as the type of manufacturing apparatus (4010), serial number (4020), subject of trouble (4030), occurrence date (4040), degree of urgency (4050), symptom (4060), remedy (4070), and progress (4080). The pieces of input information are transmitted to the maintenance database via the Internet, and appropriate maintenance information is sent back from the maintenance database and displayed on the display. The user interface provided by the web browser realizes hyperlink functions (4100 to 4120), as shown in FIG. 13. This allows the operator to access detailed information of each item, receive the latest-version software to be used for a manufacturing apparatus from a software library provided by a vendor, and receive an operation guide (help information) as a reference for the operator in the factory.

Figure 14:
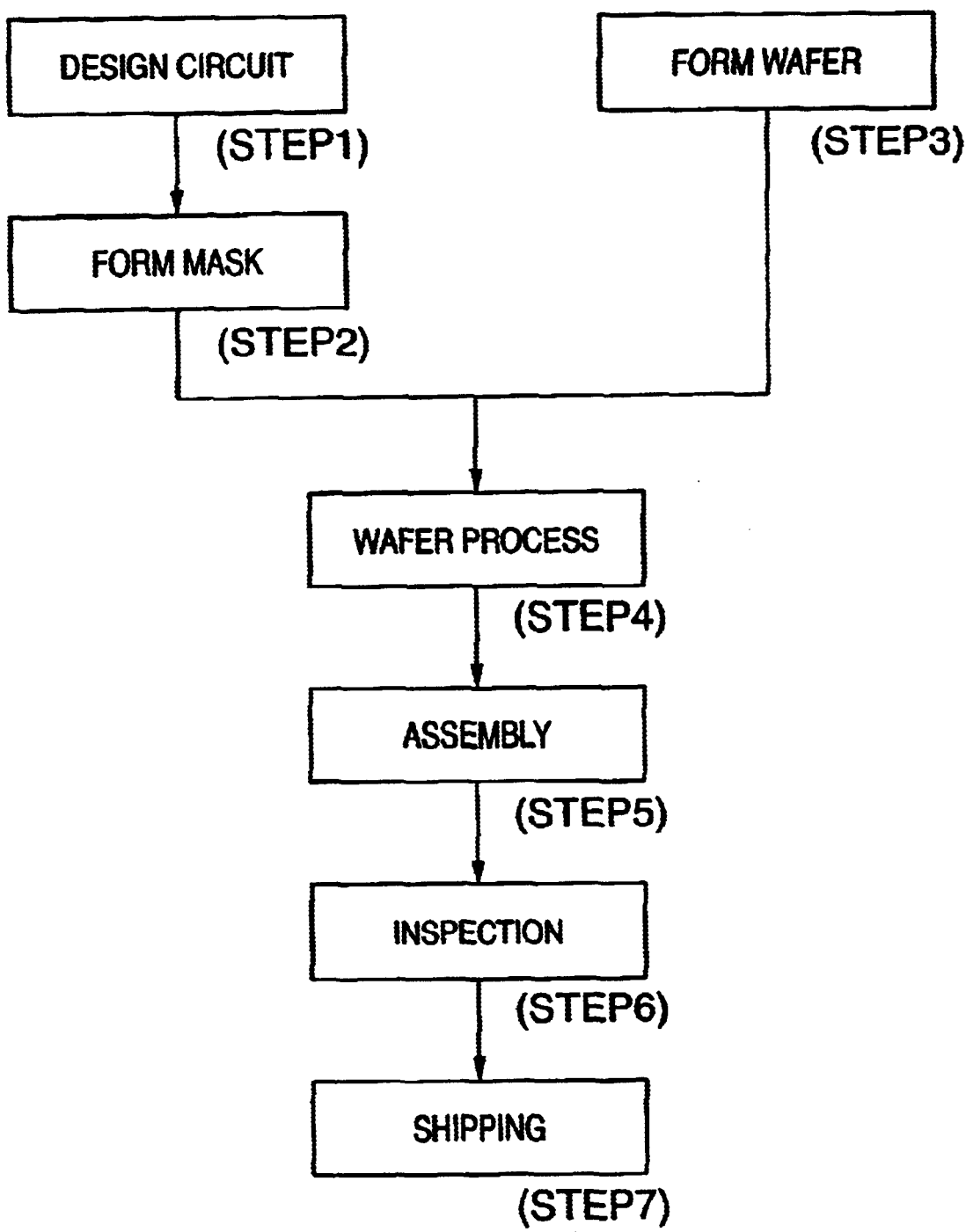
FIG. 14 is a flow chart for explaining the flow of a semiconductor device manufacturing process.

A semiconductor device manufacturing process using the above-described production system will be explained. FIG. 14 shows the flow of the whole manufacturing process of the semiconductor device. In step 1 (circuit design), a semiconductor device circuit is designed. In step 2 (mask formation), a mask is formed based on the designed circuit pattern. In step 3 (wafer formation), a wafer is formed by using a material such as silicon. In step 4 (wafer process) called a pre-process, an actual circuit is formed on the wafer by lithography using the prepared mask and wafer. Step 5 (assembly) called a post-process is the step of forming a semiconductor chip by using the wafer formed in step 4, and includes an assembly process (dicing and bonding) and packaging process (chip encapsulation). In step 6 (inspection), the semiconductor device manufactured in step 5 undergoes inspections such as an operation confirmation test and durability test. After these steps, the semiconductor device is completed and shipped (step 7). For example, the pre-process and post-process may be performed in separate dedicated factories. In this case, each of the factories receives maintenance by the above-described remote maintenance system. Information for production management and apparatus maintenance may be communicated between the pre-process factory and the post-process factory via the Internet or dedicated network.

Figure 15:
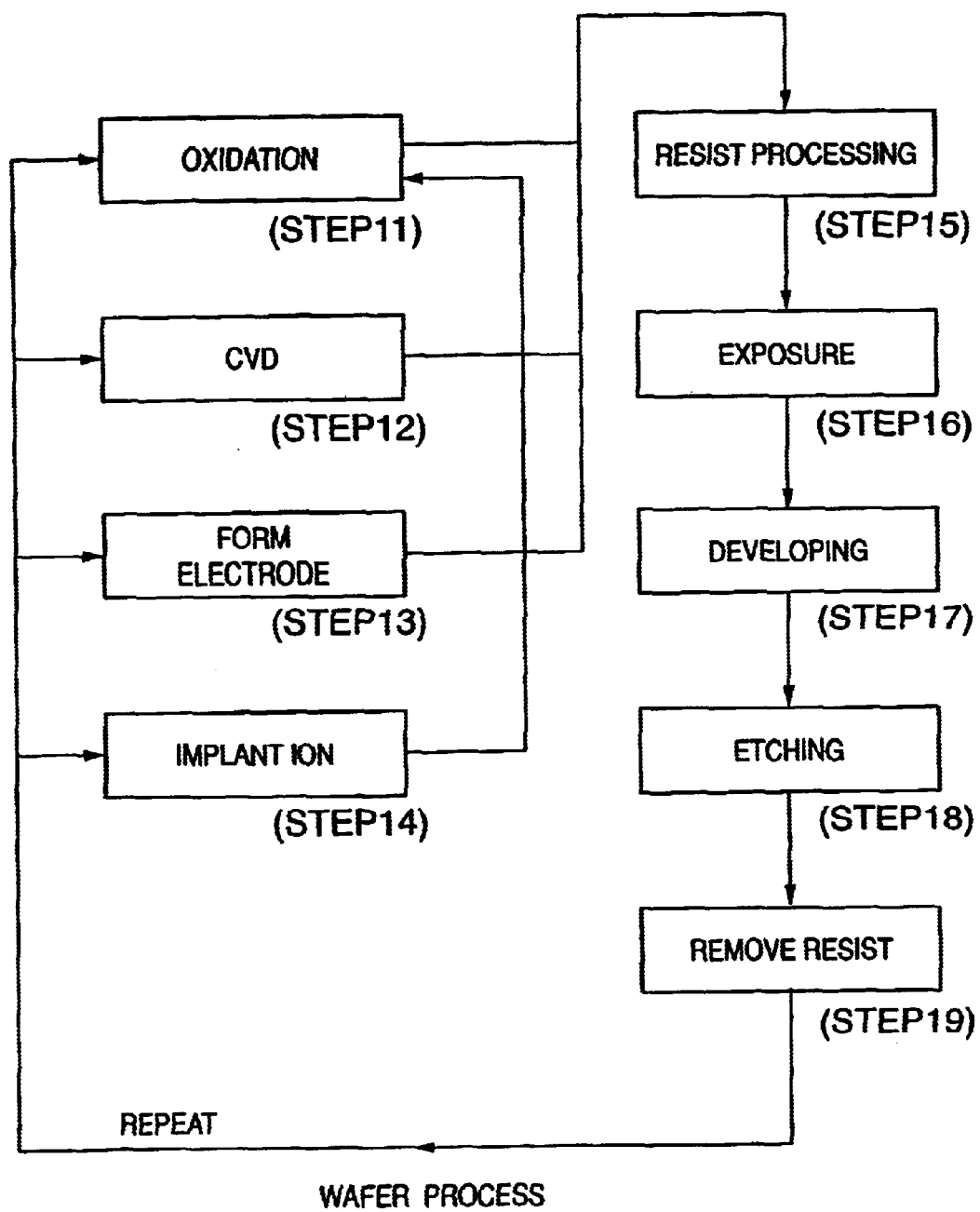
FIG. 15 is a flow chart for explaining a wafer process in detail.

FIG. 15 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus transfers the circuit pattern onto the wafer. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents a trouble in advance. Even if a trouble occurs, the manufacturing apparatus can be quickly recovered. The productivity of the semiconductor device can be increased in comparison with the prior art.

The present invention can provide an apparatus and method for evaluating, e.g., variations in moving standard deviation and utilizing the evaluation result.

As many apparently widely different embodiments of the present invention can be made without departing from the spirit and scope thereof, it is to be understood that the invention is not limited to the specific embodiments thereof except as defined in the claims.

What is claimed is:

1. A scanning exposure apparatus for transferring a pattern of a master to a substrate with slit-shaped exposure light while a master stage holding the master and a substrate stage holding the substrate are moved, comprising:
   a measurement unit arranged to measure positional sync deviations between said master stage and said substrate stage with respect to each of a plurality of points in an exposure shot region on the substrate during scanning exposure of each of the plurality of points to the light;
   a first calculation unit arranged to calculate a standard deviation of the positional sync deviations measured by said measurement unit with respect to each of the plurality of points in the exposure shot region;
   a second calculation unit arranged to calculate a variation of the standard deviations calculated by said first calculation unit with respect to the exposure shot region; and
   a process unit arranged to execute a process based on the vibration calculated by said second calculation unit.

2. An apparatus according to claim 1, wherein said process unit determines whether the variation of the standard deviations is allowable, and executes a process based on the determination.

3. An apparatus according to claim 1, wherein said second calculation unit calculates the variation of the standard deviations based on an assumption that the standard deviations distribute as an $\chi^2$ distribution.

4. An apparatus according to claim 3, wherein said second calculation unit calculates, as the variation of the standard deviations, a confidence limit value of a distribution of the standard deviations set by a likelihood.

5. An apparatus according to claim 1, wherein said process unit controls a process of the transferring with respect to an exposure shot region on the substrate.

6. An apparatus according to claim 5, wherein said process unit sets a setting time before the transferring with respect to an exposure shot region on the substrate.

7. An apparatus according to claim 5, wherein said process unit sets respective moving speeds of said master stage and said substrate stage with respect to an exposure shot region on the substrate.

8. An apparatus according to claim 5, wherein said process unit sets an exposure order of a plurality of exposure shot regions on the substrate.

9. An apparatus according to claim 5, wherein said process unit applies a vibration to at least one of said master stage and said substrate stage with respect to an exposure shot region on the substrate.

10. An apparatus according to claim 5, wherein said second calculation unit calculates the variation of the standard deviations with respect to each of a plurality of exposure shot regions on the substrate.

11. An apparatus according to claim 1, wherein said process unit controls to display information concerning the variation of the standard deviations.

12. An apparatus according to claim 1, wherein said process unit controls to store information concerning the variation of the standard deviations.

13. An apparatus according to claim 1, wherein said process unit controls to transfer information concerning the variation of the standard deviations to an external apparatus.

14. An apparatus according to claim 1, wherein said process unit controls to stop an operation of said apparatus based on information concerning the variation of the standard deviations.

15. An apparatus according to claim 1, wherein said process unit controls a process based on a number of exposure shot regions of which the variation of the standard deviations is not allowable.

16. A device manufacturing method comprising steps of:
   installing a scanning exposure apparatus defined in claim 1; and
   manufacturing a device using the scanning exposure apparatus.

17. A scanning exposure method of transferring a pattern of a master to a substrate with slit-shaped exposure light while a master stage holding the master and a substrate stage holding the substrate are moved, comprising the steps of:
   measuring positional sync deviations between the master stage and the substrate stage with respect to each of a plurality of points in an exposure shot region on the substrate during scanning exposure of each of the plurality of points to the light;
   first calculating of a standard deviation of the positional sync deviations measured in said measuring step with respect to each of the plurality of points in the exposure shot region;
   second calculating of a variation of the standard deviations calculated in said first calculating step with respect to the exposure shot region; and
   executing a process based on the variation calculated in said second calculating step.

18. A scanning exposure apparatus in which a scanning exposure is executed by moving a master and a substrate, comprising:
   a measurement unit which measures a plurality of sync deviations with respect to each of a plurality of points on the substrate while moving said master and said substrate; and
   a process unit which executes a process based on a variation of standard deviations, each of the standard deviations being calculated from the plurality of sync deviations with respect to a different one of the plurality of points.

19. A device manufacturing method comprising steps of:
   installing a scanning exposure apparatus defined in claim 18; and
   manufacturing a device using the scanning exposure apparatus.

20. A scanning exposure method by which a scanning exposure is executed while moving a master and a substrate, comprising the steps of:

measuring a plurality of sync deviations with respect to each of a plurality of points on the substrate while moving the master and the substrate; and executing a process based on a variation of standard deviations, each of the standard deviations being calculated from the plurality of sync deviations with respect to a different one of the plurality of points.

* * * * *

UNITED STATES PATENT AND TRADEMARK OFFICE
CERTIFICATE OF CORRECTION

PATENT NO. : 6,704,093 B2
DATED : March 9, 2004
INVENTOR(S) : Hiroshi Kurosawa

It is certified that error appears in the above-identified patent and that said Letters Patent is hereby corrected as shown below:

Column 2,
Line 24, "in a" should read -- in an --.

Column 9,
Line 58, "where $\epsilon(y)$:" should read -- where $\epsilon(y)$: --.

Column 10,
Line 6, "$(\epsilon(Y-D/2+kVT)-MA(Y))$"." should read -- $(\epsilon(Y-D/2+kVT)-MA(Y))$". --
Line 28, "(2) $\epsilon(y)$" should read -- (2) $\epsilon(y)$ --.
Line 30, "$(==\epsilon_k)$" should read -- $(==\epsilon_k)$ --.
Line 44, "$P(\epsilon_k)=N(\mu_0, \sigma_0^2)$" should read -- $P(\epsilon_k)=N(\mu_0, \sigma_0^2)$ --.

Column 11,
Line 64, "$\epsilon_k$" should read -- $\epsilon_k$ --.

Column 19,
Line 49, "vibration" should read -- variation --.

Signed and Sealed this

Twenty-second Day of February, 2005

JON W. DUDAS
*Director of the United States Patent and Trademark Office*